(12) United States Patent
Puthenthermadam et al.

(10) Patent No.: US 9,721,652 B2
(45) Date of Patent: Aug. 1, 2017

(54) STATE DEPENDENT SENSING FOR WORDLINE INTERFERENCE CORRECTION

(71) Applicant: SanDisk Technologies LLC, Plano, TX (US)

(72) Inventors: Sarath Puthenthermadam, San Jose, CA (US); Deepanshu Dutta, Fremont, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/354,446

(22) Filed: Nov. 17, 2016

(65) Prior Publication Data

US 2017/0140814 A1    May 18, 2017

Related U.S. Application Data

(60) Provisional application No. 62/256,604, filed on Nov. 17, 2015.

(51) Int. Cl.
*G11C 16/10* (2006.01)
*G11C 11/56* (2006.01)
(Continued)

(52) U.S. Cl.
CPC ...... *G11C 11/5642* (2013.01); *G11C 11/5628* (2013.01); *G11C 11/5635* (2013.01);
(Continued)

(58) Field of Classification Search
CPC ................ G11C 16/10; G11C 16/26
(Continued)

(56) References Cited

U.S. PATENT DOCUMENTS 7,187,585 B2   3/2007  Li et al.
7,193,898 B2   3/2007  Cernea
(Continued)

OTHER PUBLICATIONS

Chen, Wei-Chen et al., "Study of the Programming Sequence Induced Back-Pattern Effect in Split-Page 3D Vertical-Gate (VG) Nand Flash," Proceedings of Technical Program—2014 International Symposium on VLSI Technology, Systems and Application (VLSI-TSA), Apr. 2014, 2 pages.
(Continued)

*Primary Examiner* — Michael Tran
(74) *Attorney, Agent, or Firm* — Vierra Magen Marcus LLP

(57) ABSTRACT

A variable compensation pass bias based on a state being sensed in non-volatile memory based is provided. Shifts in the apparent charge stored by a memory cell can occur because of coupling based on charge stored by adjacent cells. To account for the shift, compensations can be applied to an adjacent word line when reading based on the different possible conditions of an adjacent cell. The effects of coupling may be more pronounced for memory cells in lower states corresponding to lower threshold voltages. A compensation pass bias can be reduced as the state being sensed at a selected word line increases to account for the different effects. A compensation pass bias for an adjacent word line may be reduced with the application of larger read reference voltages to a selected word line. Other variations to a compensation pass bias are provided.

20 Claims, 24 Drawing Sheets

(51) Int. Cl.
*G11C 16/34* (2006.01)
*G11C 16/04* (2006.01)
*G11C 16/08* (2006.01)

(52) U.S. Cl.
CPC ...... *G11C 11/5671* (2013.01); *G11C 16/0483* (2013.01); *G11C 16/08* (2013.01); *G11C 16/10* (2013.01); *G11C 16/3459* (2013.01)

(58) Field of Classification Search
USPC ........................................ 365/185.03, 185.24
See application file for complete search history.

(56) References Cited

U.S. PATENT DOCUMENTS

| | | | |
|---|---|---|---|
| 7,196,128 B2 | 3/2007 | Lappe et al. | |
| 7,196,928 B2 | 3/2007 | Chen | |
| 7,196,946 B2 | 3/2007 | Chen et al. | |
| 7,218,552 B1 | 5/2007 | Wan et al. | |
| 7,310,272 B1 | 12/2007 | Mokhlesi et al. | |
| 7,391,650 B2 | 6/2008 | Mokhlesi et al. | |
| 7,436,709 B2 | 10/2008 | Higashitani | |
| 7,436,733 B2 | 10/2008 | Mokhlesi | |
| 7,450,421 B2 | 11/2008 | Mokhlesi et al. | |
| 7,499,319 B2 | 3/2009 | Mokhlesi | |
| 7,518,923 B2 | 4/2009 | Mokhlesi | |
| 7,522,454 B2 | 4/2009 | Li et al. | |
| 7,535,763 B2 | 5/2009 | Hemink | |
| 7,616,505 B2 | 11/2009 | Mui et al. | |
| 7,755,946 B2 | 7/2010 | Dunga et al. | |
| 7,813,181 B2 | 10/2010 | Cernea | |
| 7,876,611 B2 | 1/2011 | Dutta et al. | |
| 7,898,864 B2 | 3/2011 | Dong | |
| 7,983,084 B2 | 7/2011 | Tokiwa et al. | |
| 8,014,205 B2 | 9/2011 | Hemink | |
| 8,051,240 B2 | 11/2011 | Dutta et al. | |
| 8,228,733 B2 | 7/2012 | Tokiwa et al. | |
| 8,400,839 B2 | 3/2013 | Li | |
| 8,526,233 B2 | 9/2013 | Hemink et al. | |
| 8,743,615 B2 | 6/2014 | Lee et al. | |
| 8,816,659 B2 * | 8/2014 | Kim | H03F 1/303 323/282 |
| 8,861,282 B2 * | 10/2014 | Dutta | G11C 16/3418 365/185.01 |
| 8,885,400 B2 | 11/2014 | Chen et al. | |
| 8,902,656 B2 * | 12/2014 | Chen | G11C 16/0483 365/185.03 |
| 8,982,637 B1 | 3/2015 | Dong et al. | |
| 9,245,637 B2 | 1/2016 | Yang et al. | |
| 9,286,987 B1 | 3/2016 | Dong et al. | |
| 9,330,770 B2 | 5/2016 | Shim et al. | |
| 9,331,686 B2 * | 5/2016 | Lin | H03K 17/162 |
| 9,336,891 B2 | 5/2016 | Yuan et al. | |
| 9,343,159 B2 * | 5/2016 | Dong | G11C 16/0483 |
| 9,418,750 B2 * | 8/2016 | Wang | G11C 16/32 |
| 9,419,565 B2 * | 8/2016 | Nobbe | H04B 17/12 |
| 9,437,302 B2 | 9/2016 | Tseng et al. | |
| 9,455,021 B2 * | 9/2016 | Deng | G11C 29/50 |
| 9,595,338 B2 * | 3/2017 | Lee | G11C 16/24 |
| 2008/0266973 A1 | 10/2008 | Sekar et al. | |
| 2009/0316489 A1 * | 12/2009 | Han | G11C 11/5642 365/185.25 |
| 2011/0122695 A1 * | 5/2011 | Li | G11C 11/5628 365/185.05 |
| 2012/0218850 A1 * | 8/2012 | Youn | G11C 8/08 365/226 |
| 2014/0340964 A1 | 11/2014 | Shiino et al. | |
| 2015/0071008 A1 * | 3/2015 | Yang | G11C 16/26 365/185.23 |
| 2015/0098271 A1 | 4/2015 | Lasser | |
| 2015/0109862 A1 | 4/2015 | Shibata et al. | |

OTHER PUBLICATIONS

U.S. Appl. No. 15/204,257, filed Jul. 7, 2016 by Costa.
U.S. Appl. No. 15/015,672, filed Feb. 4, 2016 by Chen et al.

* cited by examiner

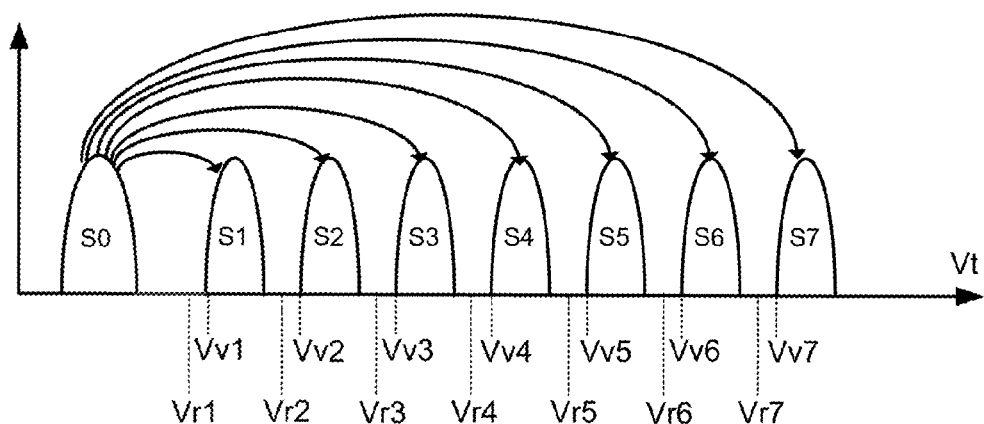
FIG. 5
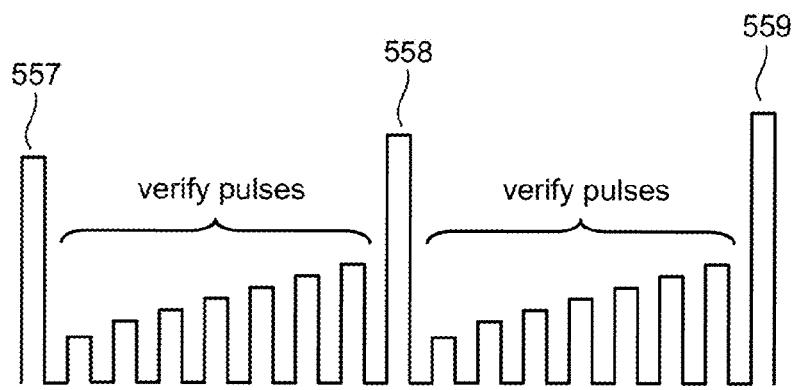
FIG. 6
FIG. 7F
|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

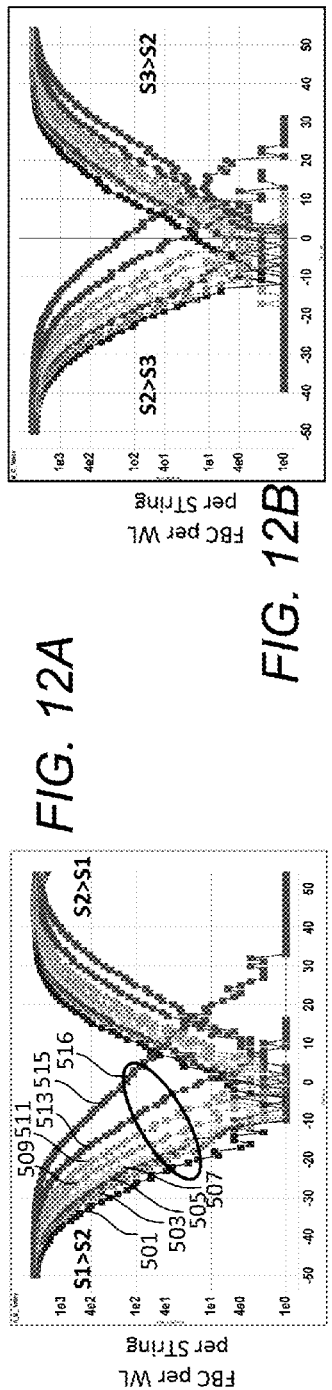
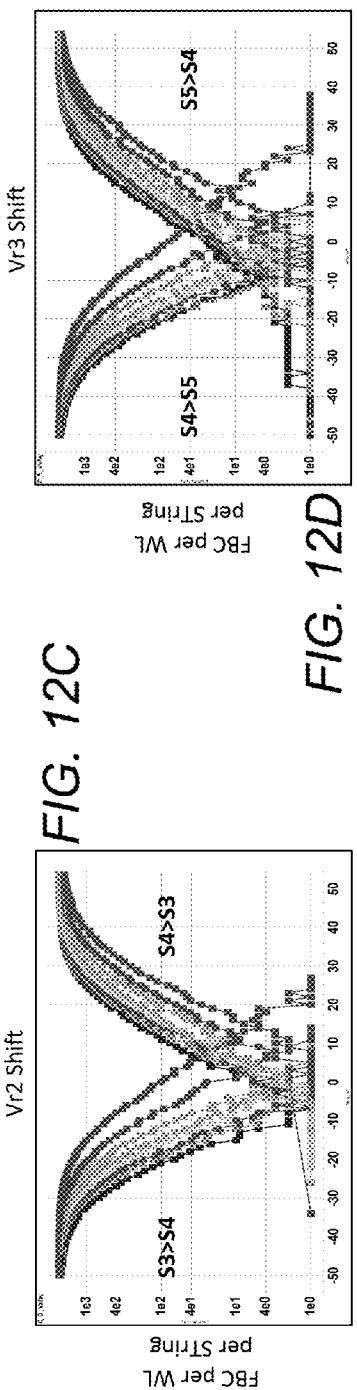
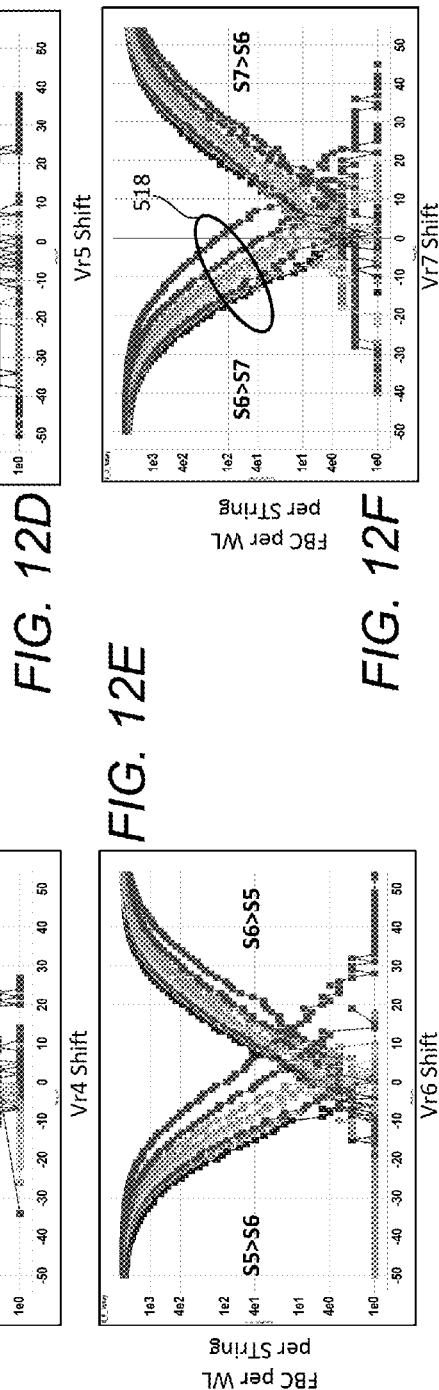
FIG. 12A  FIG. 12B  FIG. 12C  FIG. 12D  FIG. 12E  FIG. 12F

|  | Zone 1<br>DLA Value = 1 | | | | | Zone 2<br>DLA Value = 0 | | | |
| --- | --- | --- | --- | --- | --- | --- | --- | --- | --- |
|  | WLn+1 State | | | | | | | | |
| WLn Read | E | 1 | 2 | 3 | 4 | 5 | 6 | 7 | |
| Vr1 | $V_{READ}L$ | $V_{READ}L$ | $V_{READ}L$ | $V_{READ}L$ | $V_{READ}L$ | $V_{READ}H1$ | $V_{READ}H1$ | $V_{READ}H1$ | $V_{READ}H\_border1$ |
| Vr2 | $V_{READ}L$ | $V_{READ}L$ | $V_{READ}L$ | $V_{READ}L$ | $V_{READ}L$ | $V_{READ}H2$ | $V_{READ}H2$ | $V_{READ}H2$ | |
| Vr3 | $V_{READ}L$ | $V_{READ}L$ | $V_{READ}L$ | $V_{READ}L$ | $V_{READ}L$ | $V_{READ}H2$ | $V_{READ}H2$ | $V_{READ}H2$ | $V_{READ}H\_border2$ |
| Vr4 | $V_{READ}L$ | $V_{READ}L$ | $V_{READ}L$ | $V_{READ}L$ | $V_{READ}L$ | $V_{READ}H3$ | $V_{READ}H3$ | $V_{READ}H3$ | |
| Vr5 | $V_{READ}L$ | $V_{READ}L$ | $V_{READ}L$ | $V_{READ}L$ | $V_{READ}L$ | $V_{READ}H3$ | $V_{READ}H3$ | $V_{READ}H3$ | $V_{READ}H\_border3$ |
| Vr6 | $V_{READ}L$ | $V_{READ}L$ | $V_{READ}L$ | $V_{READ}L$ | $V_{READ}L$ | $V_{READ}H4$ | $V_{READ}H4$ | $V_{READ}H4$ | |
| Vr7 | $V_{READ}L$ | $V_{READ}L$ | $V_{READ}L$ | $V_{READ}L$ | $V_{READ}L$ | $V_{READ}H4$ | $V_{READ}H4$ | $V_{READ}H4$ | |

*FIG. 18*

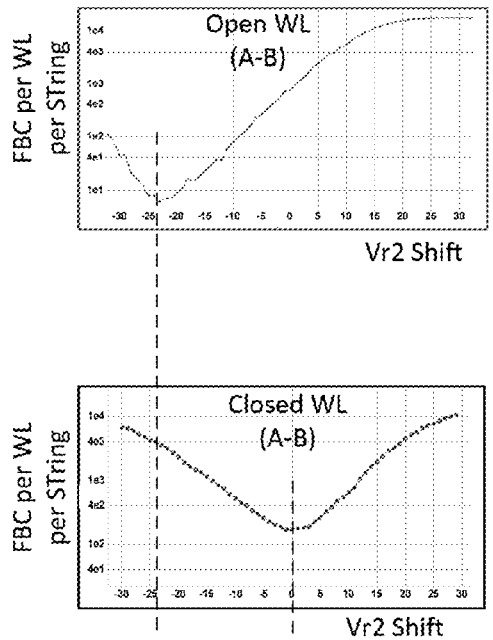
FIG. 19A
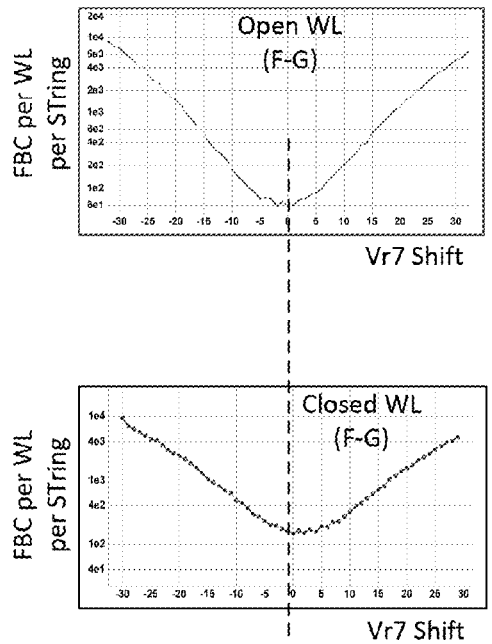
FIG. 19B
| WLn Read Open | WLn+1 Not Programmed | |
|---|---|---|
| Vr1 | $V_{READ}L1$ | $V_{READ}L\_border1$ |
| Vr2 | $V_{READ}L2$ | |
| Vr3 | $V_{READ}L2$ | $V_{READ}L\_border2$ |
| Vr4 | $V_{READ}L3$ | |
| Vr5 | $V_{READ}L3$ | $V_{READ}L\_border3$ |
| Vr6 | $V_{READ}L4$ | |
| Vr7 | $V_{READ}L4$ | |
FIG. 20

STATE DEPENDENT SENSING FOR WORDLINE INTERFERENCE CORRECTION

CLAIM OF PRIORITY

The present application claims priority from U.S. Provisional Patent Application No. 62/256,604, entitled "State Dependent Sensing for Wordline Interference Correction in Bics," by Puthenthermadam et al., filed Nov. 17, 2015, incorporated by reference herein in its entirety.

BACKGROUND OF THE INVENTION

Semiconductor memory devices have become more popular for use in various electronic devices. For example, non-volatile semiconductor memory is used in cellular telephones, digital cameras, personal digital assistants, mobile computing devices, non-mobile computing devices and other devices. Flash memory is among the most popular non-volatile semiconductor memories.

Some non-volatile memory devices are used to store two ranges of charges and, therefore, the memory cells can be programmed/erased between two data states: an erased state and a programmed state (corresponding to data "1" and data "0"). Such a device is referred to as a binary device or a single-level cell (SLC) and the data is binary data.

A multi-state flash memory cell (storing multi-state data) is implemented by identifying multiple, distinct allowed threshold voltage ranges (ie data states). Each distinct threshold voltage range corresponds to a predetermined value for the set of data bits. For example, some memory cells can store two bits, and others can store three bits. The specific relationship between the data programmed into the memory cell and the threshold voltage ranges (also called data states) of the memory cell depends upon the data encoding scheme adopted for the memory cells. For example, U.S. Pat. No. 6,222,762 and U.S. Patent Application Publication No. 2004/0255090, both describe various data encoding schemes for multi-state flash memory cells.

In addition to the gains in capacity resulting from multi-state memory architectures, consumers have seen significant advantages as a result of a history of steadily scaling down the physical dimensions of memory cells. Smaller memory cells can be packed more densely on a given die area, allowing the user to access more memory capacity for the same price as an older memory technology. In order to achieve the advantage of higher memory capacity for a fixed die size, these smaller memory cells must be packed more closely together. Doing so, however, may result in a greater number of operational errors, such as errors when programming data to the memory and/or reading back user data from the memory. The errors may result in increased processing times to recover the data, or in some instances a corruption of data that has been stored.

Once a non-volatile storage element has been programmed, it is important that its programming state can be read back with a high degree of reliability. However, the sensed programming state can sometimes vary from the intended programming state due to factors including noise and the tendency of devices to gravitate towards charge neutrality over time.

Consequently, it is common for to encounter erroneous or corrupted data bits at the time of reading non-volatile memory. Typically, some form of error correction control (ECC) is applied to correct erroneous or corrupted data. One common control stores additional parity bits to set the parity of a group of data bits to a required logical value when the data is written. The informational and parity bits form an encoded word stored during the write process. The ECC decodes the bits by computing the parity of the group of bits when reading the data to detect any corrupted or erroneous data. Despite these considerations, there remains a need for improved memory operations in non-volatile memory.

BRIEF DESCRIPTION OF THE DRAWINGS

Like-numbered elements refer to common components in the different figures.

FIG. 5 depicts threshold voltage distributions and a process for programming non-volatile memory.

FIG. 6 depicts a plurality of programming pulses and a plurality of verify pulses.

FIG. 7F is a table depicting an example data encoding.

FIGS. 12A-12F depict a set of fail bit count distributions for a group of memory cells based on the state being sensed.

FIG. 18 is a table depicting compensation pass biases for reading a group of non-volatile memory cells in one embodiment.

FIGS. 19A-19B depict fail bit count distributions for open and closed word lines when sensing at Vr2 and Vr7.

FIG. 20 is a table depicting a variable low compensation pass bias.

DETAILED DESCRIPTION

The disclosed technology is directed to reducing errors when sensing in non-volatile memory. A variable compensating pass bias for an adjacent memory cell is provided that is dependent on the state being sensed at a selected word line. The selected word line is sensed for a plurality of states. For example, the selected memory cell can receive a plurality of read reference voltages, while the remaining memory cells receive a read pass voltage. Multiple compensating pass biases are applied to an adjacent memory cell while applying each read reference voltage to the selected memory cell. Each compensating pass bias corresponds to a possible condition of the adjacent memory cell. For a selected memory cell, the results of sensing while applying a particular pass bias are selected based on the condition of the adjacent memory cell. At least one compensating bias is reduced as the state or threshold voltage being sensed is increased. For example, a high pass bias corresponding to a programmed condition of an adjacent memory cell can be reduced as the read reference voltage for the selected word line is increased.

Shifts in the apparent charge stored by a charge storage region such as charge trap layer in a non-volatile storage element can occur because of word line interference based on charge stored by adjacent storage elements. To account for the shift, different compensations are applied to an adjacent word line when reading a selected word line based on different possible conditions of cells on the adjacent word line. For at least one condition of an adjacent cell, the corresponding compensation pass bias is decreased as the threshold voltage being sensed at the selected word line increases.

When sensing for lower level states corresponding to lower threshold voltages, the effects of word line interference may be more pronounced than when sensing at higher level states corresponding to higher threshold voltages. Accordingly, the pass bias corresponding to a particular condition of an adjacent memory cell for a compensated read can be varied based on the state being sensed at the selected word line. A compensation pass bias for an adjacent word line can be adjusted for higher level states. A high pass bias corresponding to a relatively high threshold voltage can be lowered as the state being sensed (or the read reference voltage) at the selected word line increases. The reduced high pass bias provides less shift in the threshold voltage of the selected memory cells to approximate the smaller shift due to word line interference. Other compensating pass biases may be adjusted.

Figure 1:
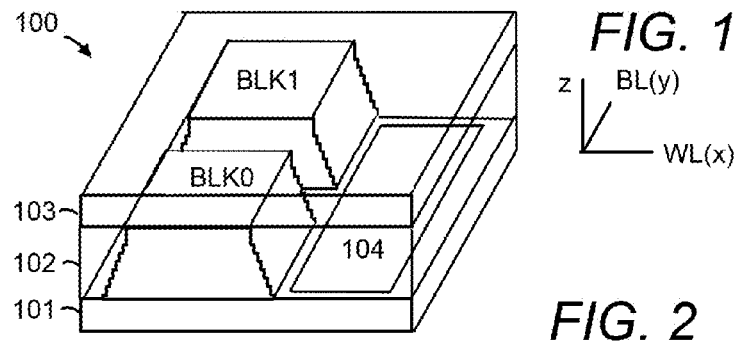
FIG. 1 is a perspective view of a 3D stacked non-volatile memory device.

FIGS. 1-4F describe one example of a memory system that can be used to implement the technology proposed herein. FIG. 1 is a perspective view of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2:
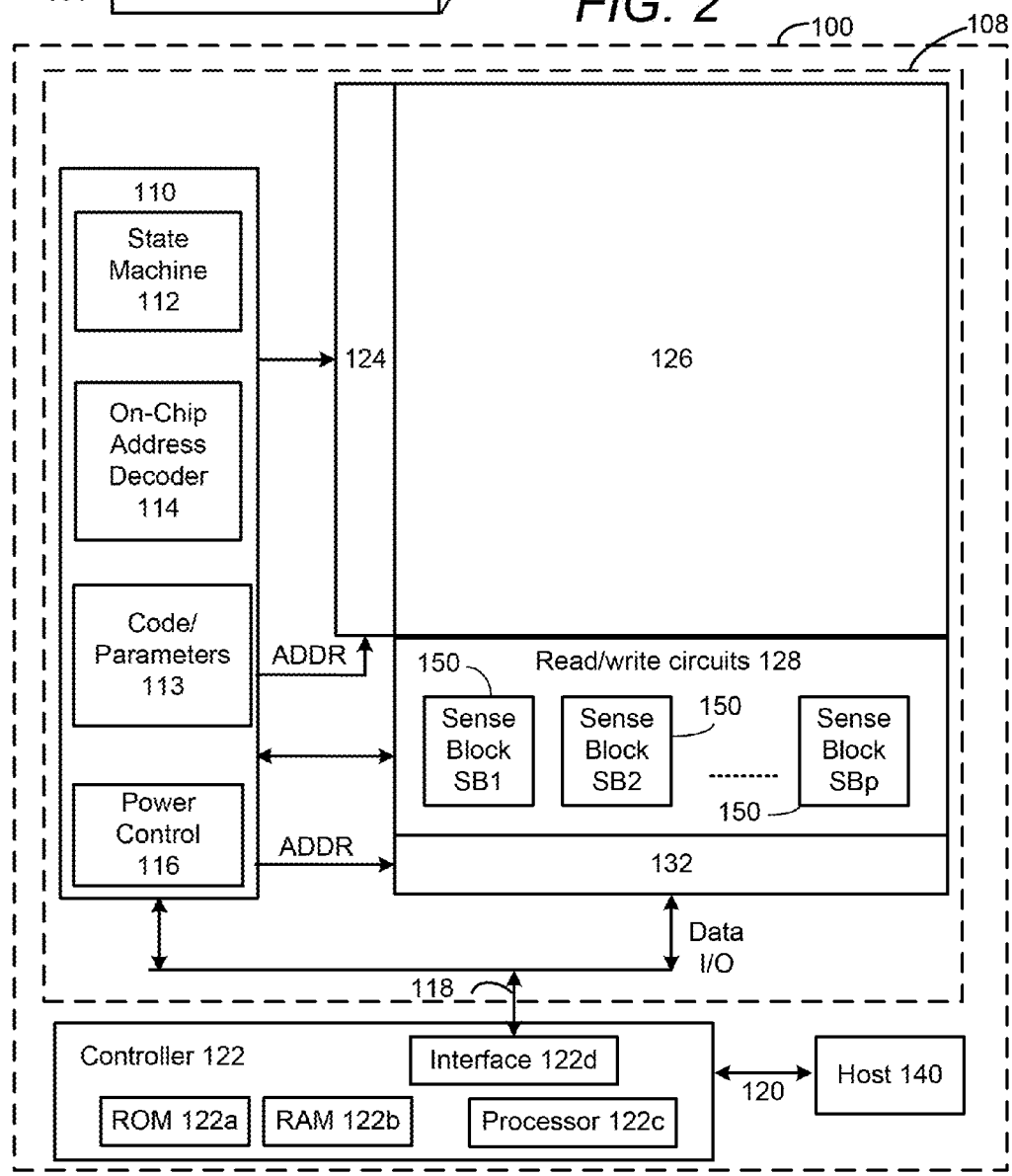
FIG. 2 is a functional block diagram of a memory device such as the 3D stacked non-volatile memory device 100 of FIG. 1.

FIG. 2 is a functional block diagram of an example memory device such as the 3D stacked non-volatile memory device 100 of FIG. 1. The components depicted in FIG. 2 are electrical circuits. Memory device 100 includes one or more memory die 108. Each memory die 108 includes a three dimensional memory structure 126 of memory cells (such as, for example, a 3D array of memory cells), control circuitry 110, and read/write circuits 128. In other embodiments, a two dimensional array of memory cells can be used. Memory structure 126 is addressable by word lines via a row decoder 124 and by bit lines via a column decoder 132. The read/write circuits 128 include multiple sense blocks 150 including SB1, SB2, . . . , SBp (sensing circuitry) and allow a page of memory cells to be read or programmed in parallel. In some systems, a controller 122 is included in the same memory device 100 (e.g., a removable storage card) as the one or more memory die 108. However, in other systems, the controller can be separate from the memory die 108. In some embodiments the controller will be on a different die than the memory die. In some embodiments, one controller 122 will communicate with multiple memory die 108. In other embodiments, each memory die 108 has its own controller. Commands and data are transferred between the host 140 and Controller 122 via a data bus 120, and between controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Code and parameter storage 113 may be provided for storing operational parameters and software. In one embodiment, state machine 112 is programmable by the software stored in code and parameter storage 113. In other embodiments, state machine 112 does not use software and is completely implemented in hardware (e.g., electrical circuits).

In one embodiment, state machine 112 is programmable by software and/or firmware stored in a storage area of control circuitry 110. The storage may store operational parameters and software which is used to program state machine 112. In other embodiments, state machine 112 does not use software and is completely implemented in hardware (e.g., electrical circuits). In one embodiment, control circuitry 110 includes registers, ROM fuses and other storage devices for storing default values such as base voltages and other parameters.

The on-chip address decoder 114 includes a memory interface that provides an address interface between addresses used by host 140 or Controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, code and parameter storage 113, power control module 116, sense blocks 150, read/write circuits 128, and controller 122 can be considered one or more control circuits (or a managing circuit) that perform the functions described herein. Reference to a control circuit or the control circuit is intended to refer to one or more control circuits. The control circuit includes a plurality of electronic components that provide multiple current paths for complex operations on the memory die 108 and/or off the memory die (e.g., by controller 122). In this manner, a circuit is a well-understood physical structure requiring electronic components and an interconnection of the components by vias, paths, and/or wires through which current flows.

The (on-chip or off-chip) controller 122 (which in one embodiment is an electrical circuit) may comprise a processor 122c, ROM 122a, RAM 122b and a Memory Interface 122d, all of which are interconnected. Processor 122C is one example of a control circuit. Other embodiments can use state machines or other custom circuits designed to perform one or more functions. The storage devices (ROM 122a, RAM 122b) comprise code such as a set of instructions, and the processor 122c is operable to execute the set of instructions to provide the functionality described herein. Alternatively or additionally, processor 122c can access code from a storage device in the memory structure, such as a reserved area of memory cells connected to one or more word lines. Memory interface 122d, in communication with ROM 122a, RAM 122b and processor 122c, is an electrical circuit that provides an electrical interface between Controller 122 and memory die 108. For example, memory interface 122d can change the format or timing of signals, provide a buffer, isolate from surges, latch I/O, etc. Processor 122C can issue commands to control circuitry 110 (or any other component of memory die 108) via Memory Interface 122d.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
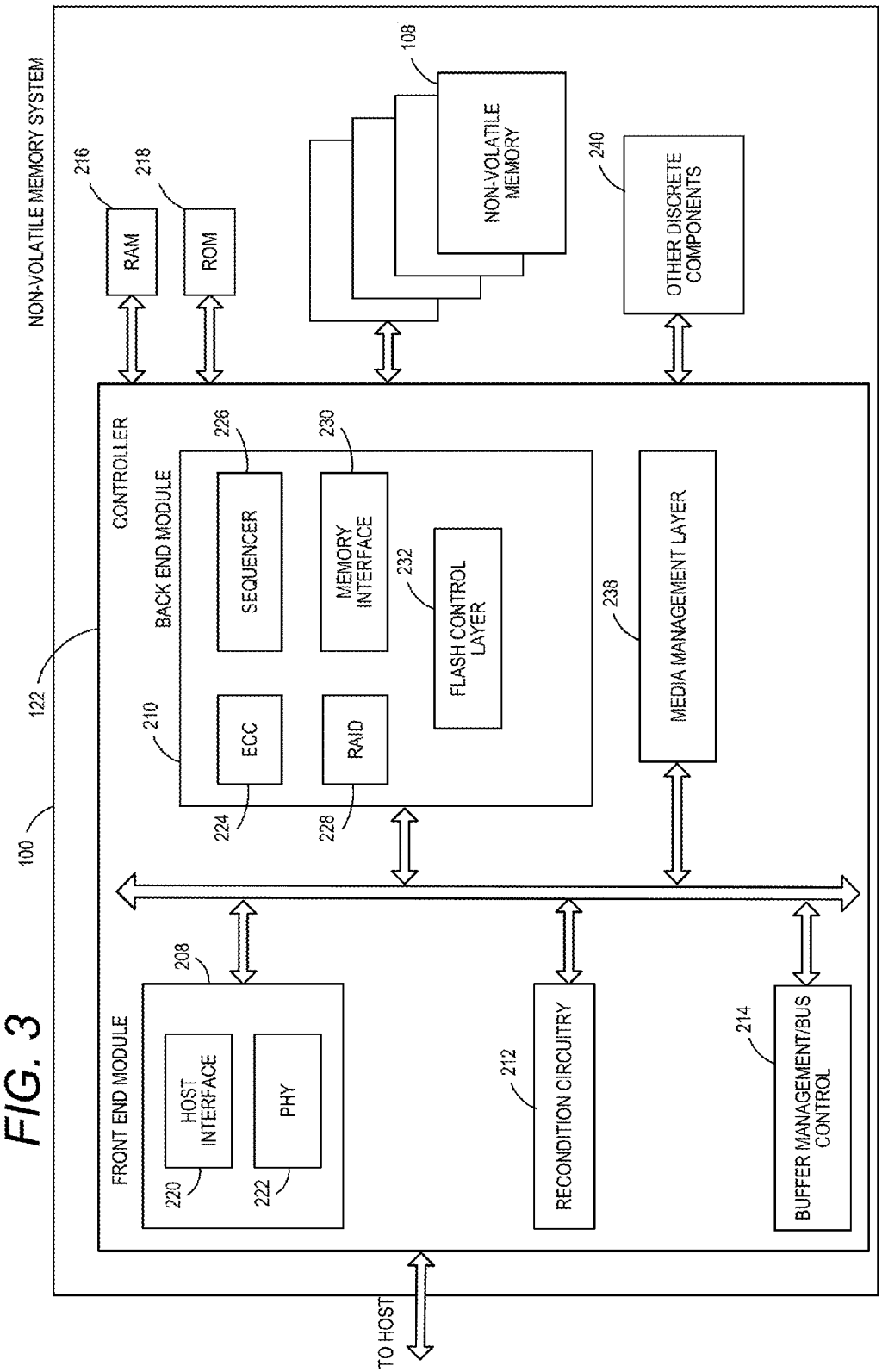
FIG. 3 is a block diagram depicting one embodiment of a controller.

FIG. 3 is a block diagram of example memory system 100, depicting more details of controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host, such as in the form of a solid state disk (SSD) drive installed in a personal computer.

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 3, controller 112 includes a front end module 208 that interfaces with a host, a back end module 210 that interfaces with the one or more non-volatile memory die 108, and various other modules that perform functions which will now be described in detail.

The components of controller 122 depicted in FIG. 3 may take the form of a packaged functional hardware unit (e.g., an electrical circuit) designed for use with other components, a portion of a program code (e.g., software or firmware) executable by a (micro)processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for controller 122 to perform the functions described herein. The architecture depicted in FIG. 3 is one example implementation that may (or may not) use the components of controller 122 depicted in FIG. 2 (i.e. RAM, ROM, processor, interface).

Controller 122 may include recondition circuitry 212, which is used for reconditioning memory cells or blocks of memory. The reconditioning may include refreshing data in its current location or reprogramming data into a new word line or block as part of performing erratic word line maintenance, as described below.

Referring again to modules of the controller 122, a buffer manager/bus controller 214 manages buffers in random access memory (RAM) 216 and controls the internal bus arbitration of controller 122. A read only memory (ROM) 218 stores system boot code. Although illustrated in FIG. 3 as located separately from the Controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction control (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

Additional components of system 100 illustrated in FIG. 3 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus Controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory 126 of die 108. The MML 238 may be needed because: 1) the flash memory may have limited endurance; 2) the flash memory 126 may only be written in multiples of pages; and/or 3) the flash memory 126 may not be written unless it is erased as a block. The MML 238 understands these potential limitations of the flash memory 126 which may not be visible to the host. Accordingly, the MML 238 attempts to translate the writes from host into writes into the flash memory 126. As described below, erratic bits may be identified and recorded using the MML 238. This recording of erratic bits can be used for evaluating the health of blocks and/or word lines (the memory cells on the word lines).

Controller 122 may interface with one or more memory dies 108. In one embodiment, Controller 122 and multiple memory dies (together comprising non-volatile storage system 100) implement a solid state drive (SSD), which can emulate, replace or be used instead of a hard disk drive inside a host, as a NAS device, etc. Additionally, the SSD need not be made to work as a hard drive.

Figure 4:
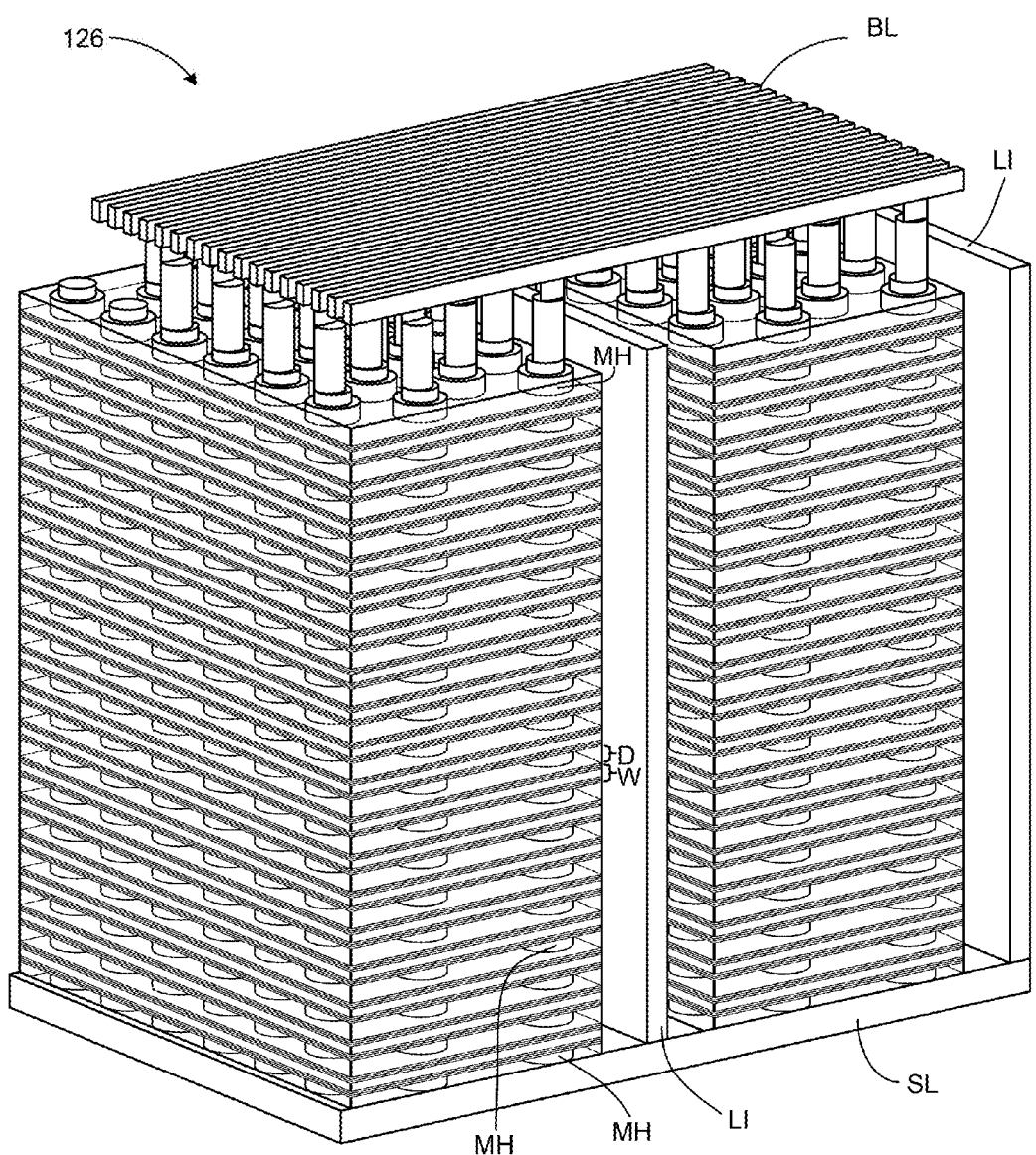
FIG. 4 is a perspective view of a portion of a three dimensional monolithic memory structure.

FIG. 4 is a perspective view of a portion of a three dimensional monolithic memory structure 126, which includes a plurality memory cells. For example, FIG. 4 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "fingers" by local interconnects LI. FIG. 4 only shows two fingers and two local interconnects LI. Below and the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three dimensional monolithic memory structure 126 is provided below with respect to FIGS. 4A-4F.

Figure 4A:
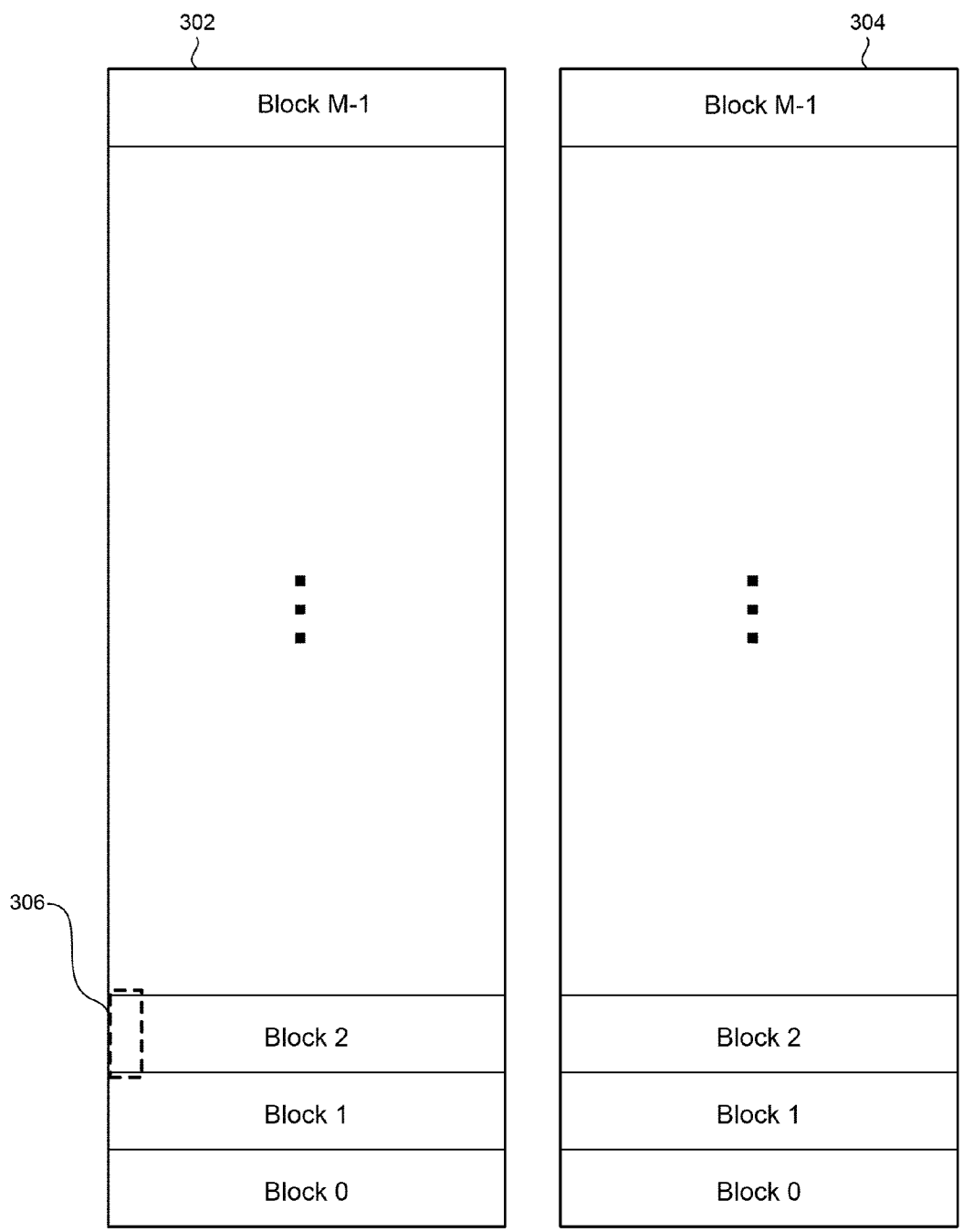
FIG. 4A is a block diagram of a memory structure having two planes.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 302 includes block 0, 2, 4, 6, . . . and plane 304 includes blocks 1, 3, 5, 7, . . . . In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits.

Figure 4B:
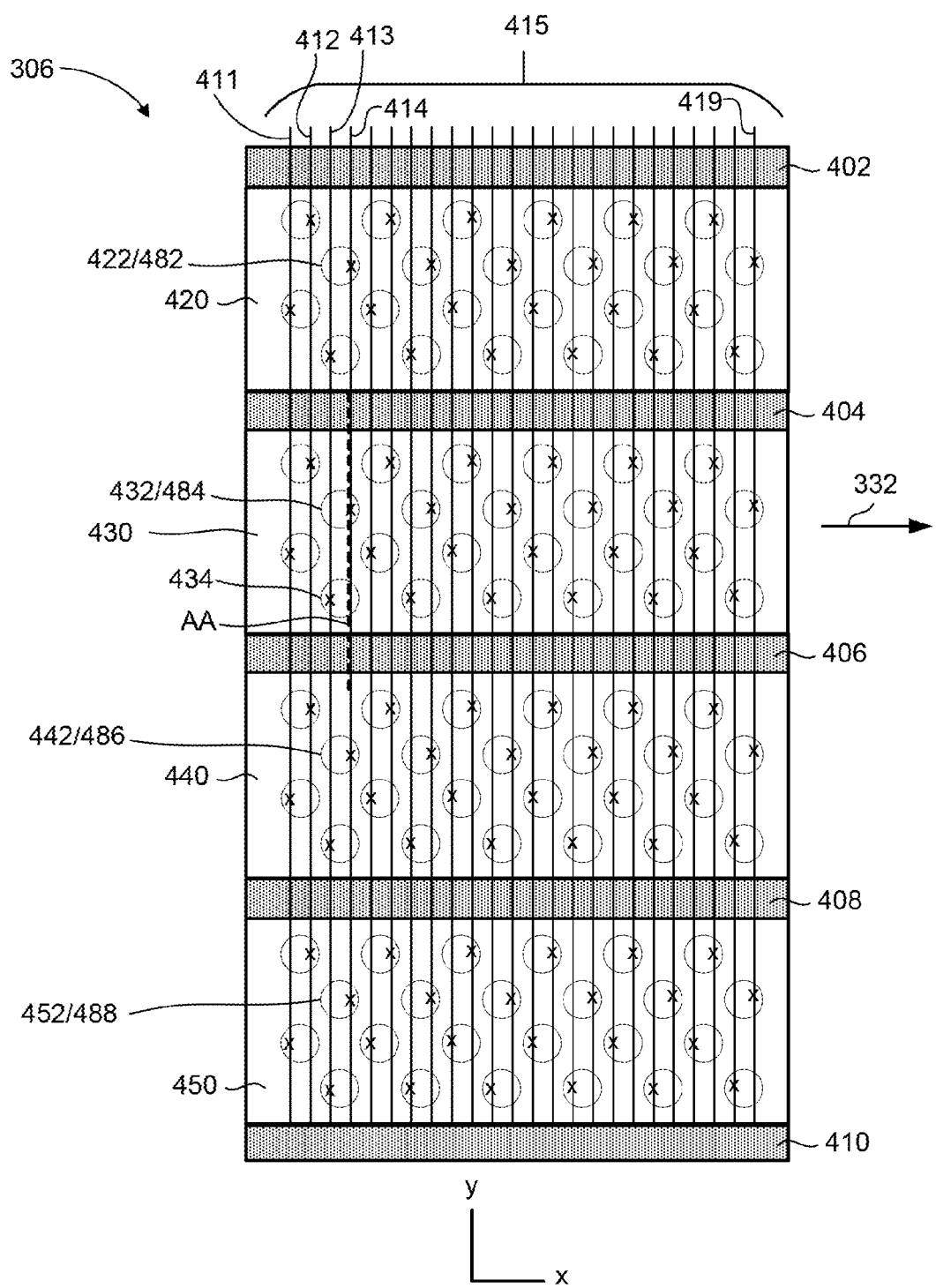
FIG. 4B depicts a top view of a portion of a block of memory cells.

FIGS. 4B-4F depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array will have 60 layers. Other embodiments have less than or more than 60 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 330 and in the direction of arrow 332, the block includes more vertical columns than depicted in FIG. 4B FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side select lines and the drain side select lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
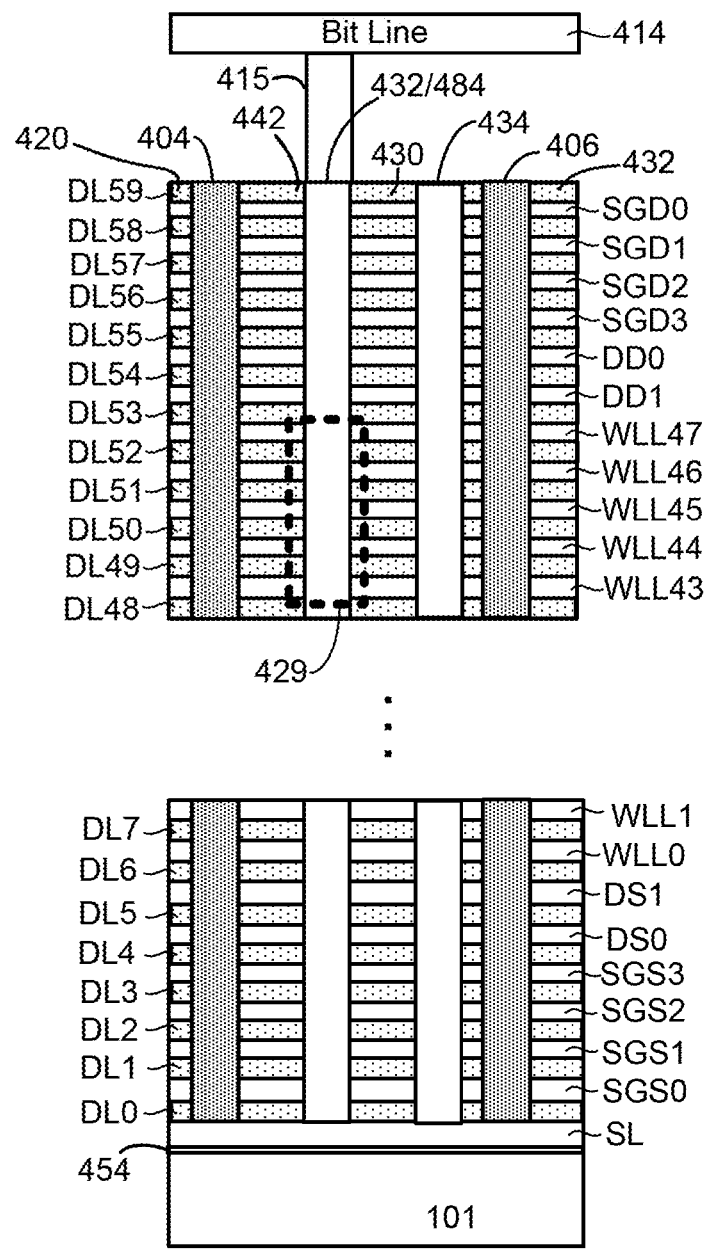
FIG. 4C depicts a cross sectional view of a portion of a block of memory cells.

FIG. 4C depicts a portion of an embodiment of three dimensional memory structure 126 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3;

four source side select layers SGS0, SGS1, SGS2 and SGS3; four dummy word line layers DD0, DD1, DS0 and DS1; and forty eight data word line layers WLL0-WLL47 for connecting to data memory cells. Other embodiments can implement more or less than four drain side select layers, more or less than four source side select layers, more or less than four dummy word line layers, and more or less than forty eight word line layers (e.g., 96 word line layers). Vertical columns 432 and 434 are depicted protruding through the drain side select layers, source side select layers, dummy word line layers and word line layers. In one embodiment, each vertical column comprises a NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DD0, DD1, DS0 and DS1 connect to dummy memory cells. A dummy memory cell does not store user data, while a data memory cell is eligible to store user data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

Figure 4D:
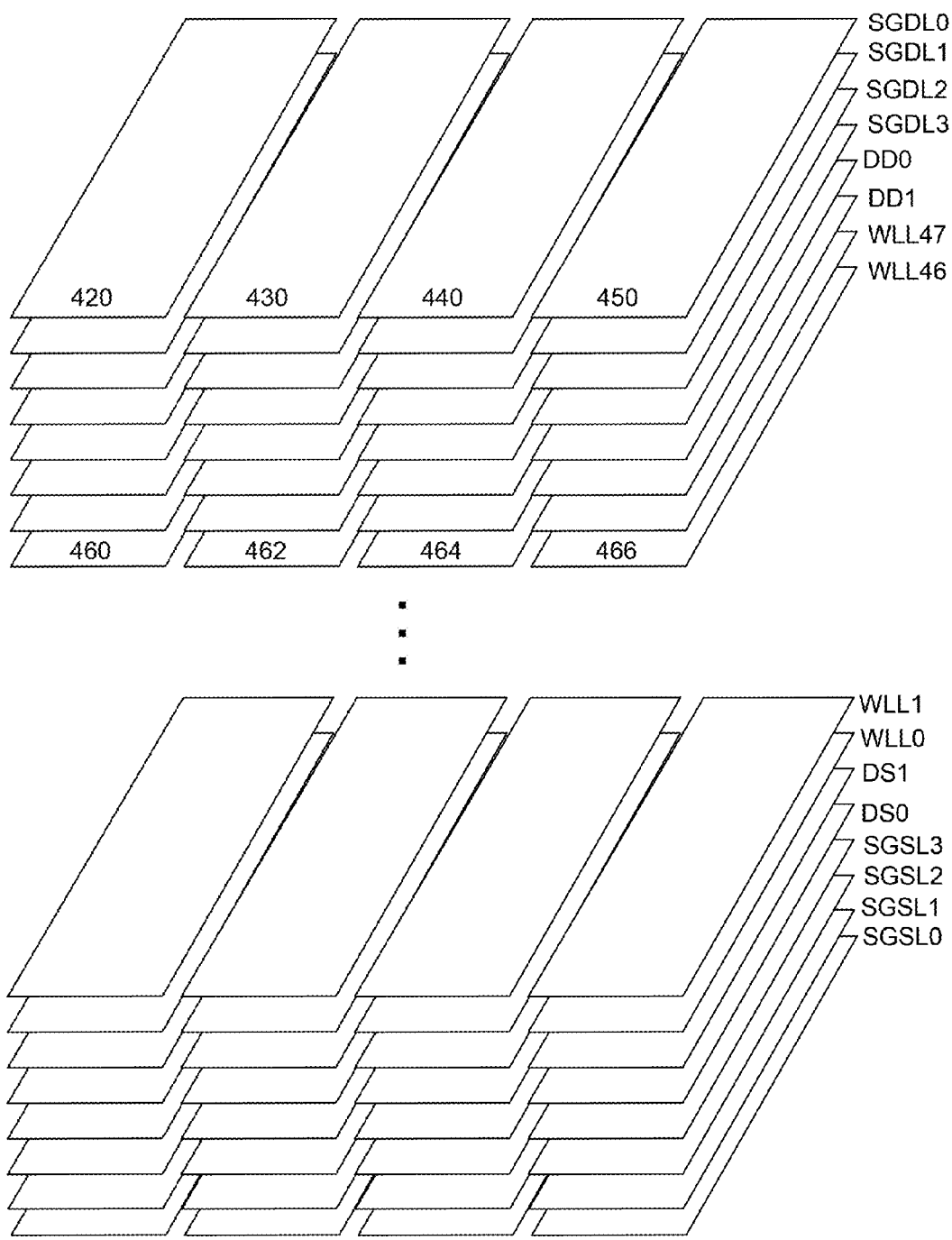
FIG. 4D depicts a view of the select gate layers and word line layers.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL47) for the block that is partially depicted in FIG. 4C. As mentioned above with respect to FIG. 4B, in one embodiment local interconnects 402, 404, 406, 408 and 410 break up each conductive layers into four regions or fingers. For example, word line layer WLL31 is divided into regions 460, 462, 464 and 466. For word line layers (WLL0-WLL31), the regions are referred to as word line fingers; for example, word line layer WLL46 is divided into word line fingers 460, 462, 464 and 466. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4E:
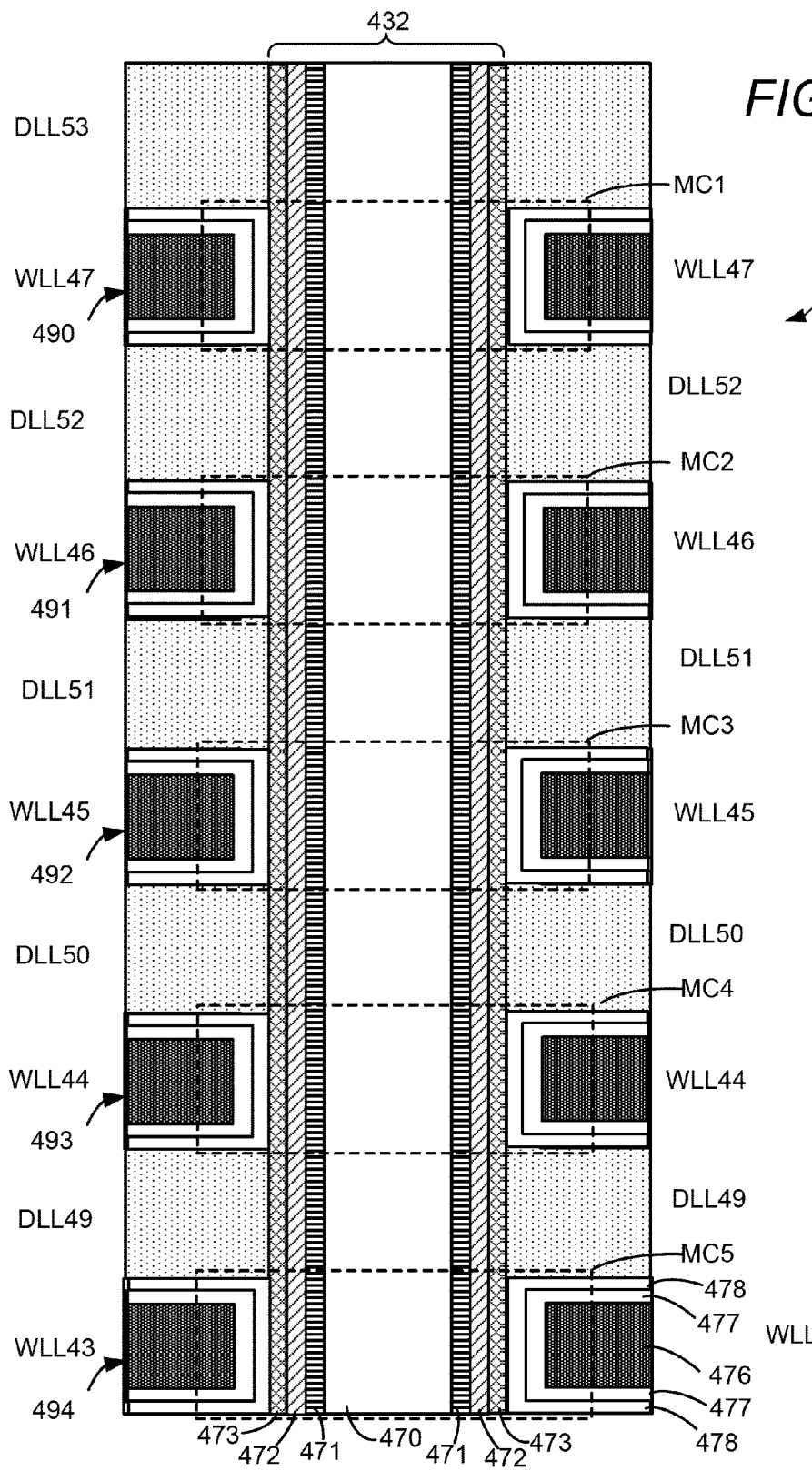
FIG. 4E is a cross sectional view of a vertical column of memory cells.

FIG. 4E depicts a cross sectional view of region 429 of FIG. 4C that includes a portion of vertical column 432. In one embodiment, the vertical columns are round and include four layers; however, in other embodiments more or less than four layers can be included and other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
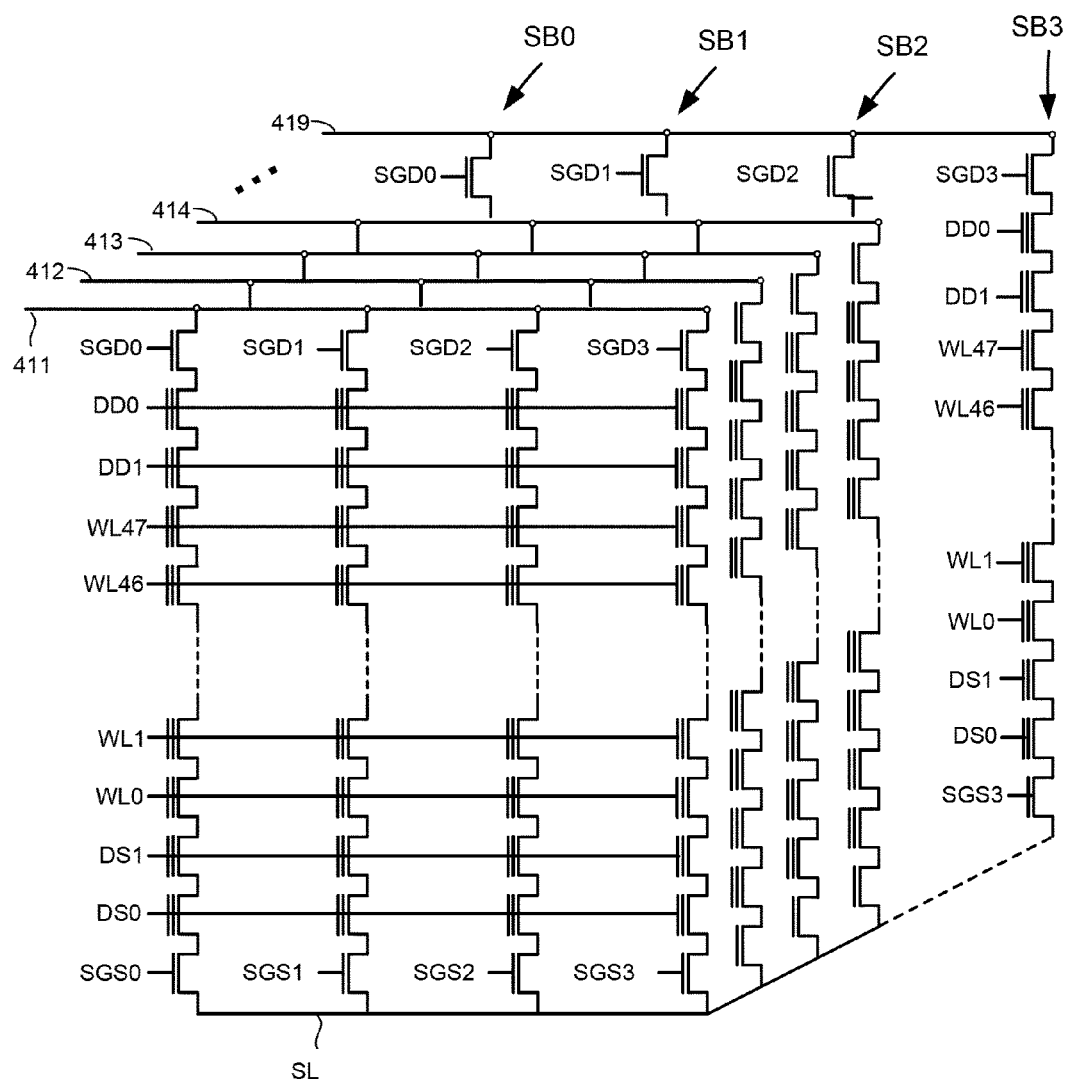
FIG. 4F is a schematic of a plurality of NAND strings.

FIG. 4F shows physical word lines WLL0-WLL47 running across the entire block. The structure of FIG. 4F corresponds to portion 306 in Block 2 of FIGS. 4A-F, including bit lines 411, 412, 413, 414, . . . 419. Within the block, each bit line connected to four NAND strings. Drain side select lines SGD0, SGD1, SGD2 and SGD3 are used to determine which of the four NAND strings connect to the associated bit line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 4-4F is a three dimensional memory structure that includes vertical NAND strings with charge-trapping material, other (2D and 3D) memory structures can also be used with the technology described herein. For example, floating gate memories (e.g., NAND-type and NOR-type flash memory ReRAM memories, magnetoresistive memory (e.g., MRAM), and phase change memory (e.g., PCRAM) can also be used.

One example of a ReRAM memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory cell array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. Adjacent data states are data states that are next to each other with respect to threshold voltage (or other attribute used to determine data value). For example, data states S3 and S4 are adjacent data states, and data states S6 and S7 are adjacent data states.

FIG. 5 also shows seven read reference voltages, Vr1, Vr2, Vr3, Vr4, Vr5, Vr6, and Vr7, for reading data from memory cells. By testing whether the threshold voltage of a given memory cell is above or below the seven read reference voltages, the system can determine what data state (i.e., S0, S1, S2, S3, . . . ) the memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv4. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In some embodiments, the program voltage applied to the control gate includes a series of pulses that are increased in magnitude with each successive pulse by a predetermined step size (e.g. 0.2 v, 0.3 v, 0.4 v, or others). Between pulses, some memory systems will verify whether the individual memory cells have reached their respective target threshold voltage ranges. For example, FIG. 10 shows a portion of a signal applied to the control gates of a plurality of memory cells connected to a common word line.

FIG. 6 shows programming pulses 557, 558 and 559, with a set of verify pulses between the programming pulses. When performing full sequence programming in one embodiment, the verification process between programming pulses will test for each of the threshold voltage distribution (data states) S1-S7. Therefore, FIG. 6 shows seven verify pulses that have magnitudes corresponding to verify target levels Vv1, Vv2, Vv3, Vv4, Vv5, Vv6, and Vv7. In some embodiments, one or more of the verify operations can be skipped (and, therefore one or more of the verify pulses can be skipped) because the verify operation is not necessary or superfluous. For example, if none of the memory cells being programmed according to FIG. 0 have reached Vv2, there is no reason to verify at Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming (including, but not limited to, multiple stage/phase programming). In some embodiments, data states S1-S7 can overlap, with controller 122 relying on ECC to identify the correct data being stored.

Figure 7A:
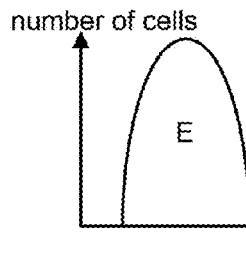
FIGS. 7A-7E show various threshold voltage distributions and describe a process for programming non-volatile memory.
Figure 7B:
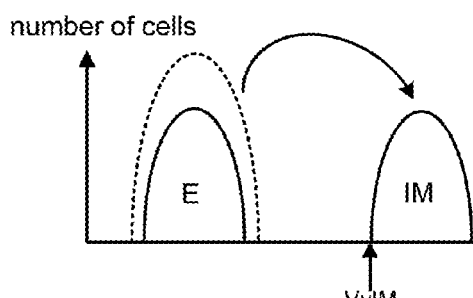

FIG. 5 shows a programming process that includes one phase where all memory cells connected to the same word line are programmed concurrently during that one phase. FIGS. 7A-7E illustrate a multi-phase programming approach. In this embodiment, the programming process includes three phases. Prior to programming, the memory cells are erased so that all memory cells connected to a common word line are in an erased threshold voltage distribution E, as depicted in FIG. 7A. During the first phase of programming, those memory cells whose targets (due to the data to be stored in those memory cells) are data states S4, S5, S6 or S7 are programmed to an intermediate state IM. Those memory cells are targeted for data states S0, S1, S2 or S3 and remain in the erased threshold voltage distribution E. The first phase is graphically depicted by FIG. 7B. Memory cells being programmed to intermediate state IM are programmed to a target threshold voltage of VvIM.

Figure 7C:
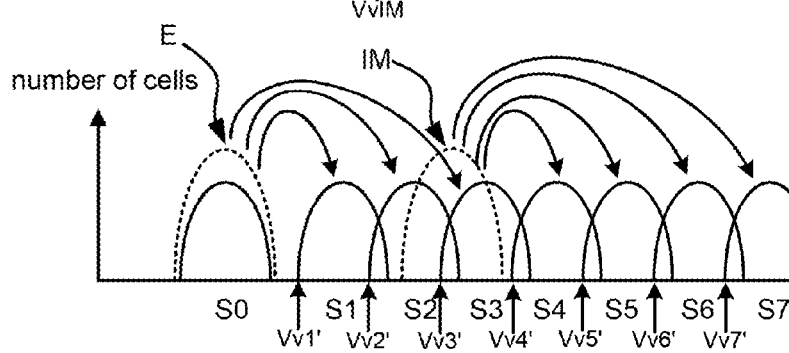
Figure 7D:
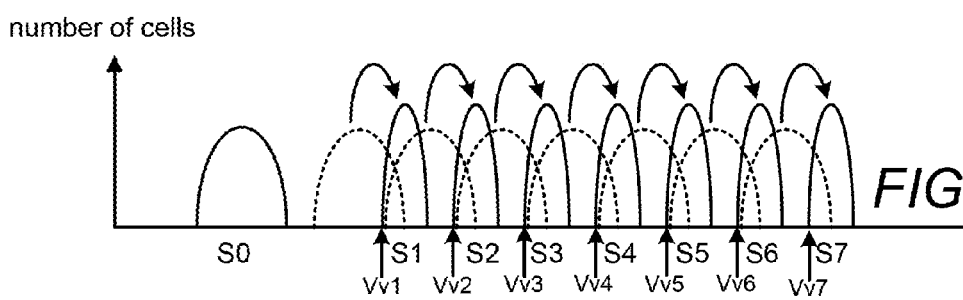
Figure 7E:
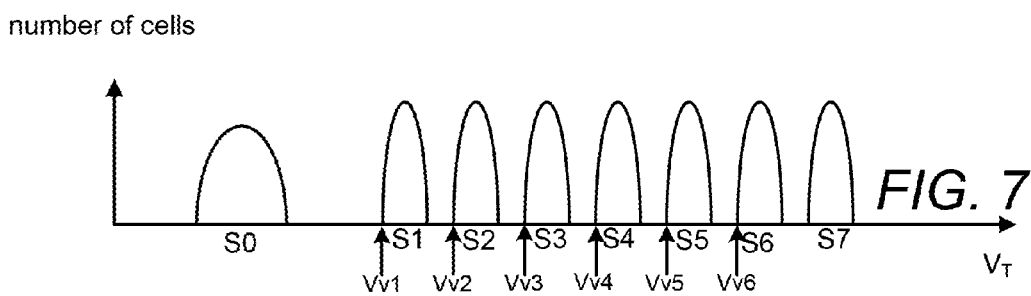

During the second phase of the programming process of FIGS. 7A-E, those memory cells that are in the erased threshold voltage distribution E are programmed to their target data states. For example, those memory cells to be programmed to data state S3 are programmed from erased threshold voltage distribution E to data state S3, those memory cells to be programmed to data state S2 are programmed from erased threshold voltage distribution E to data state S2, those memory cells to be programmed to data state S1 are programmed from erase threshold voltage distribution E to data state S1, and those memory cells to be in data state S0 are not programmed during the second phase of the programming process. Thus, erased threshold voltage distribution E becomes data state S0. Also, during the second phase, memory cells are programmed from the intermediate state IM to various data states S4-S7. For example, those memory cells to be programmed to data state S7 are programmed from the intermediate state IM to data state S7, those memory cells targeted to be in data state S6 are programmed from intermediate state IM to data state S6, both memory cells to be programmed to data state S5 are programmed from intermediate state IM to data state S5, and those memory cells to be programmed to data state S4 are programmed from intermediate state IM to data state S4. This second phase of programming is illustrated in FIG. 7C.

As can be seen in FIG. 7C, at the end of the second phase of programming data states S1-S7 overlap with neighboring data states. For example, data state S1 overlaps with data state S2, data state S2 overlaps with data states S1 and S3, data state S3 overlaps with data states S2 and S4, data state S4 overlaps with data states S3 and S5, data state S5 overlaps with data states S4 and S6, and data state S6 overlaps with data states S5 and S7. In some embodiments, all or some of the data states do not overlap.

In the third phase of programming, each of data states S1-S7 are tightened so that they no longer overlap with neighboring states. This is depicted graphically by FIG. 7D. The final result of the three phrase programming process is depicted in step 7E, which shows data states S0-S7. In some embodiments, data state S0 is wider than data states S1-S7. FIG. 7F shows one example of how data is encoded for the data states of FIGS. 5A-E.

In some embodiments, those memory cells to be programmed to data state S4 are not programmed during the second phase and, therefore, remain in intermediate state IM. During the third programming phase, the memory cells are programmed from IM to S4. In other embodiments, memory cells destined for other states can also remain in IM or E during the second phase.

Word line interference may result from parasitic cell effects due to continuous charge trap layers as well as electrostatic charge coupling between charge storage regions. Word line interference can cause errors during read operations. When an adjacent memory cell is in a higher level state with more electrons in the charge storage region, a lower level memory cell on the selected word line may be harder to turn on such that the parasitic cell results in higher word line interference. Additionally, the charge stored in a charge storage region of a memory cell can undergo an apparent shift because of electrical field coupling associated with charge stored at a neighboring memory cell's floating gate or other charge storage region (e.g., dielectric charge storage region). While the electric field from a charge on the floating gate of any memory cell in a memory array can couple to the floating gate of any other memory cell in the array, the effect is most pronounced and noticeable with adjacent memory cells. Adjacent memory cells may include neighboring memory cells that are on the same bit line, neighboring memory cells on the same word line, or neighboring memory cells that are on both a neighboring bit line and neighboring word line, and thus, adjacent from each other in a diagonal direction. The apparent shift in charge can result in errors when reading the memory state of a memory cell.

The effects of word line interference are most pronounced in situations where a memory cell adjacent a target memory cell is programmed subsequent to the target memory cell, although its effects may be seen in other situations as well. A charge placed on the charge storage region of an adjacent memory cell, or a portion of the charge, will effectively be coupled to the target memory cell through electrical field coupling, resulting in an apparent shift of the threshold voltage of the target memory cell. A memory cell's apparent threshold voltage can be shifted to such a degree after being programmed that it will not turn on and off (conduct) under the applied read reference voltages as expected for a memory cell in the memory state to which it was intended to be programmed.

Typically, rows of memory cells are programmed starting with the word line (WL0) adjacent to the source side select gate line or a dummy word line. Programming proceeds sequentially thereafter by word line (WL1, WL2, WL3, etc.) through the strings of cells such that at least one page of data is programmed in an adjacent word line (WLn+1) after completing programming (placing each cell of the word line into its final state) of the preceding word line (WLn). This pattern of programming results in an apparent shift of the threshold voltage of memory cells after being programmed due to floating gate coupling. For every word line except the last word line of a NAND string to be programmed, an adjacent word line is programmed subsequent to completing programming of the word line of interest. The negative charge added to the floating gates of memory cells on the adjacent, later programmed word line raises the apparent threshold voltage of the memory cells on the word line of interest. Programming can also begin with the word line adjacent to the drain side select gate and proceed sequentially toward the source side select gate. In this case, the floating gate coupling can similarly effect the apparent threshold voltage of memory cells.

Figure 8:
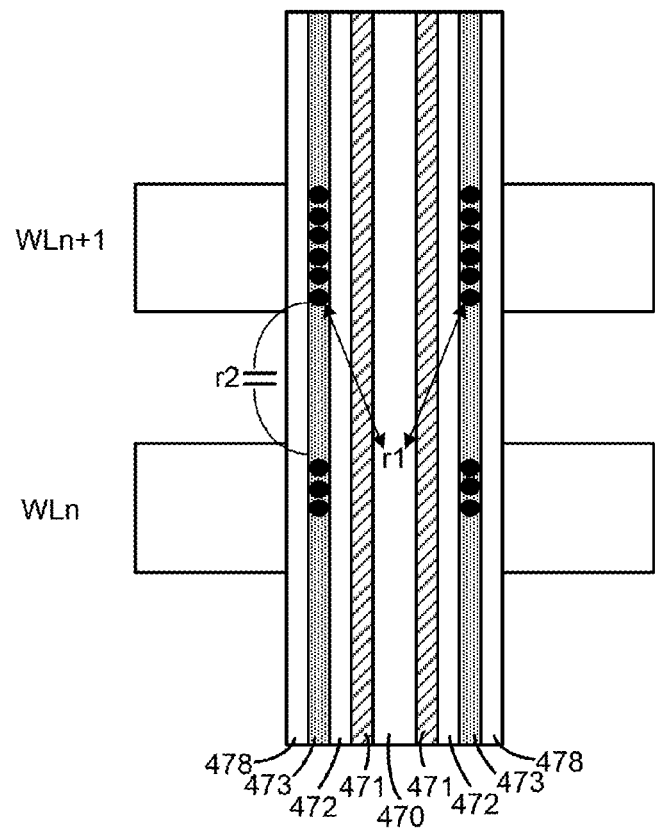
FIG. 8 is a block diagram illustrating capacitive coupling between two neighboring memory cells.

FIG. 8 graphically explains the concept of word line interference. FIG. 8 depicts a simplified view of FIG. 4E with exemplary neighboring word lines WLn and WLn+1 adjacent to a memory hole MH including inner core layer 470, channel layer 471, tunneling dielectric layer 472, charge trapping layer 473, and blocking layer 478. As a result of programming the memory cell at WLn+1, the memory cell at WLn may experience word line interference components r1 and r2. The component r1 represents the parasitic effects of the cell at WLn+1 due to the continuous charge trap layer 473. This parasitic cell effect from WLn+1 may result in a state-dependent word line interference effect at WLn. Programming at WLn+1 results in charge stored in charge trap layer 473. When the memory cell at WLn+1 is programmed to a high state corresponding to a high threshold voltage, more electrons are stored in the charge trap layer 473 as shown. If the memory cell at WLn is in a lower state, when sensing at the low read reference voltage for the state, it may be difficult to turn on the selected memory cell. Thus, the parasitic effects of the adjacent memory cell results in higher word line interference at WLn. The component r2 represents electrostatic coupling between the electrons stored at WLn+1 and the electrons stored at WLn. When the memory cell at WLn+1 is programmed to a higher state, more electrostatic coupling will result. In one embodiment, the component r1 is the coupling ratio between the charge stored in the adjacent charge storage regions for WLn and WLn+1. The component r1 corresponds to the capacitance of the neighboring charge storage regions divided by the sum of all capacitive couplings of the charge storage region at WLn to all the other electrodes surrounding it.

Figure 9:
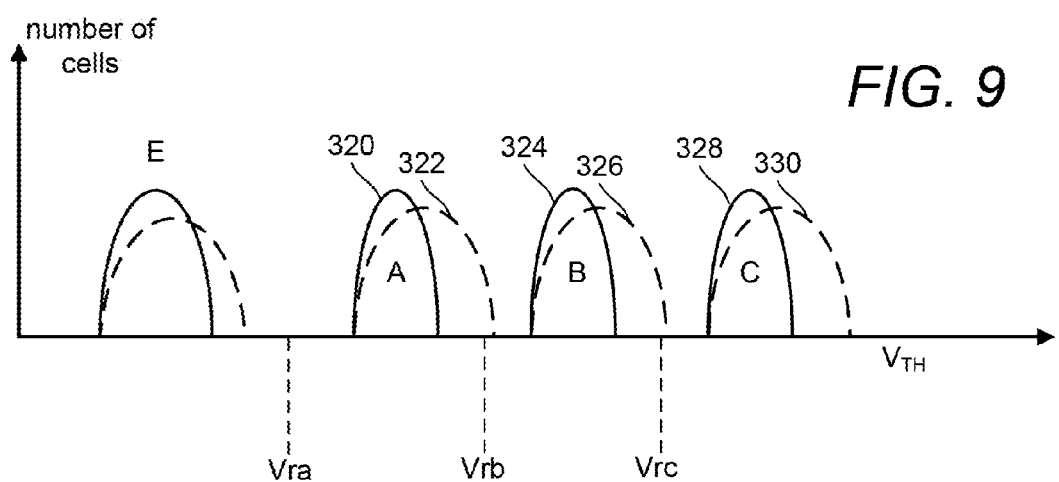
FIG. 9 is an example of a set of threshold voltage distributions illustrating the effects of floating gate coupling.

FIG. 9 shows the threshold voltage distributions for a row of memory cells (e.g., WLn) before (solid curves) and after (dotted curves) its adjacent row (WLn+1) is programmed. Each distribution is widened as a result of adding negative charge to the floating gates of the memory cells of the adjacent word line. Because of electrostatic charge coupling, the negative charge of a later programmed memory cell on WLn+1 will raise the apparent threshold voltage of a memory cell on WLn that is connected to the same bit line. Distributions 320 and 322 represent the cells of a selected word line WLn in state S1 before and after programming the adjacent word line WLn+1, respectively. Distributions 324 and 326 represent the cells of WLn in state S2 before and after programming WLn+1, respectively. Distributions 328 and 330 represent the cells of WLn in state S3 after programming WLn+1, respectively. Because the distributions are widened, memory cells may be read incorrectly as in an adjacent state. Memory cells at the upper end of each distribution can have an apparent threshold voltage above a corresponding read compare point. For example, when applying reference voltage Vr2, certain memory cells programmed to state S1 may not conduct sufficiently because of the shift in their apparent threshold voltage. These cells may incorrectly be read as in state S2, causing read errors. The later programmed cells can also effect the apparent threshold voltage of memory cells of WLn that are connected to different bit lines, such as those connected to adjacent bit lines.

As described before, the coupling effect occurs due to the asymmetry in the charge environment experience by a cell between the time it was program-verified and the time it is read. More particularly, during programming of cells on the word line WLn, the cells on WLn+1 are not yet programmed and their charge storage elements have little or no negative charges. Thus, the cells in WLn are programmed verified under such an environment. Later, the cells on WLn+1 are programmed and now some of their charge storage elements are programmed with more negative charges. These negative charges now present a more negative charge environment when the cells on WLn are read. The effect is as if a cell on WLn is programmed with more negative charge; i.e., the cell appears more programmed with a higher threshold.

One scheme for correction of coupling effects during read is referred to as the direct look ahead ("DLA") scheme. A correction or compensation is applied while reading a selected cell that takes into account the condition of the adjacent memory cell on the adjacent word line. A compensation is effected by biasing the adjacent word line WLn+1 such that the resultant coupling offsets the effects of programming WLn+1, reducing or eliminating errors during reading the selected word line WLn.

The sense level is adjusted virtually by biasing an adjacent word line based on its programmed state or more generally, its relative programmed condition. This enables the correct state to be read from the selected memory cell in spite of perturbing charges that are subsequently programmed into neighboring memory cells.

Figure 10A:
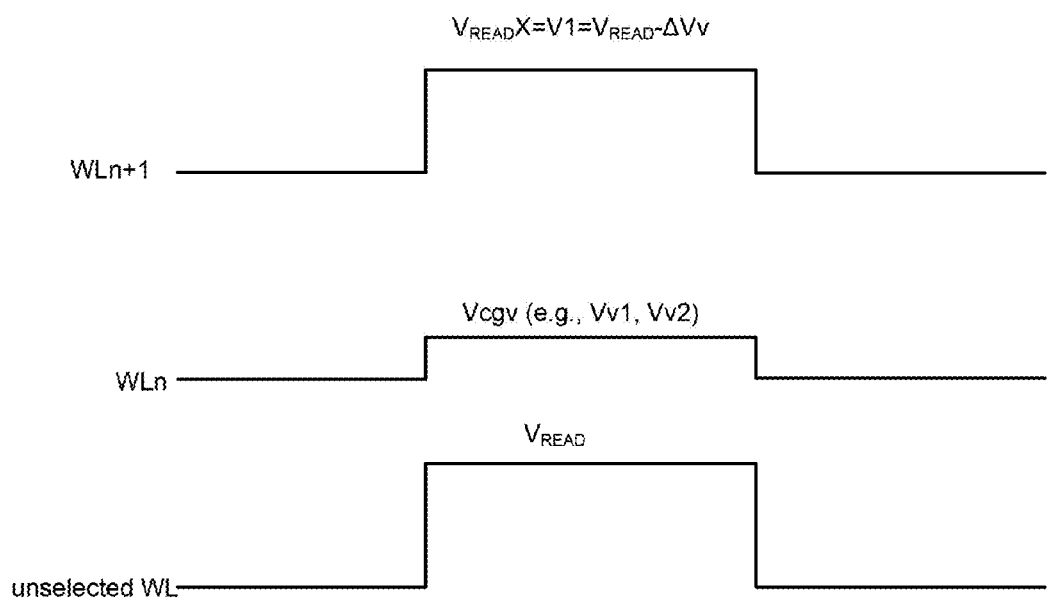
FIG. 10A is a timing diagram depicting the bias conditions during program verify for a direct look ahead compensated read scheme.
Figure 10B:
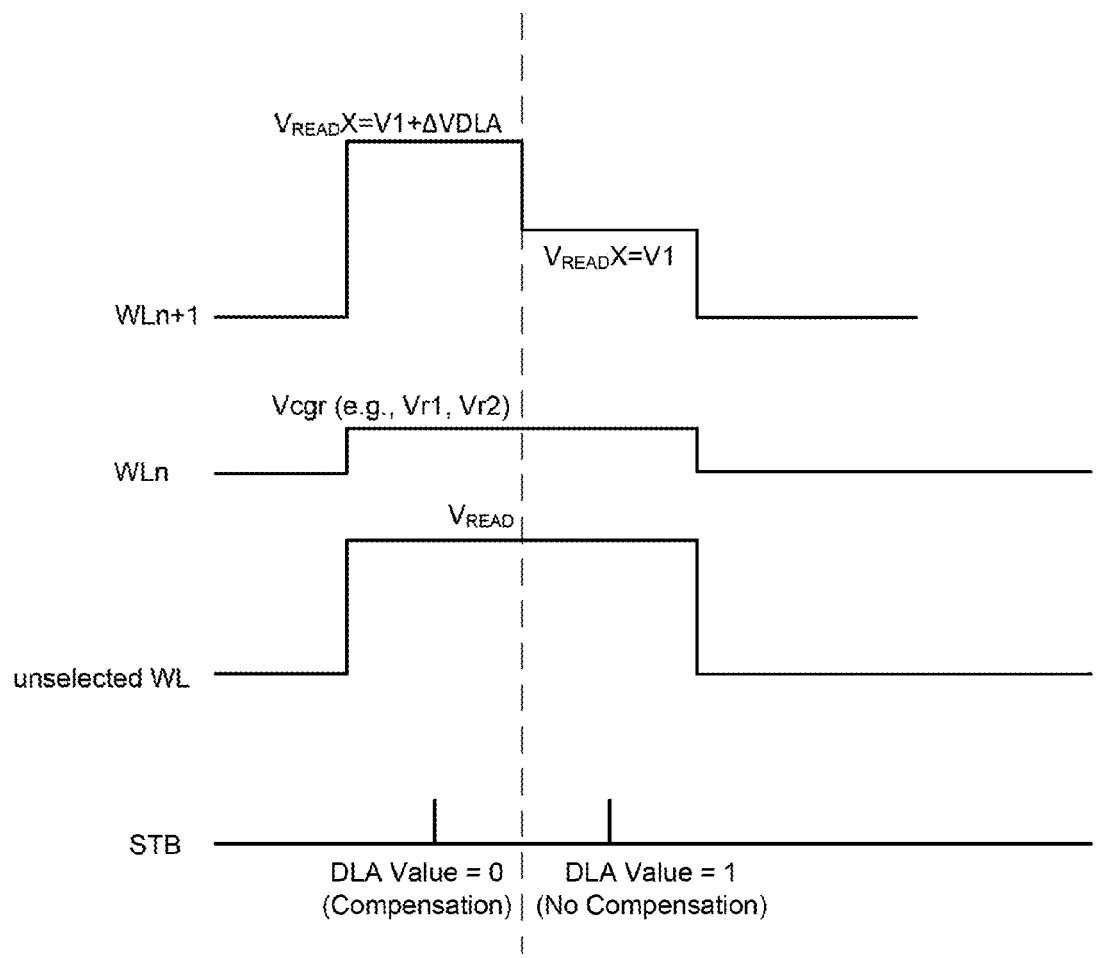
FIG. 10B is a timing diagram depicting the bias conditions during a compensated read.

FIG. 10A and FIG. 10B illustrate an example of biasing on a selected word line and adjacent word lines WLn+1 and WLn−1 during a program verify and a subsequent read, respectively. FIG. 10A illustrates biasing conditions under a DLA scheme during program verify for the selected word line WLn, the adjacent word line WLn+1, and the other unselected word lines WL. During program verify, the sensing voltage level applied to WLn is one of vV1, vV2, . . . (see FIG. 5 and FIG. 7E). In the case of a NAND cell, the neighboring cells immediately below and above the cell to be sensed are part of the same NAND string (see FIG. 4F.) Therefore a voltage sufficient to turn on the neighboring cells, $V_{READ}$, is applied to all unselected word lines. In one embodiment, however, since the cells on WLn+1 are in the erased state, the biasing on WLn+1 is reduced to $V_{READ}X=V1$ which is substantially lower than the normal $V_{READ}$, while still being able to turn on the cells on WLn+1. This depressed basic level will allow a differential bias boost to be applied in a subsequent read operation without having to apply an excessive word line voltage. In one embodiment, V1 is equal to $V_{READ}-\Delta V_V$, where $\Delta V_V$ is an offset to reduce $V_{READ}$ by an amount to enable subsequent compensation increases.

FIG. 10B illustrates the biasing conditions under a DLA scheme during a compensated read for the word line being sensed and its adjacent word lines. In particular, WLn is the selected word line among a NAND string (see FIG. 4F). During sensing, a selected read reference voltage Vcgr (e.g., Vr1, Vr2, . . . ) is applied to the selected word line WLn. The rest of the unselected word lines except for WLn+1 will have a voltage $V_{READ}$ to turn on the other cells in the NAND chain. The word line WLn+1 will have a voltage bias $V_{READ}X$ applied to it. The voltage bias is applied as two read pass voltages $V_{READ}X=V1$ and $V_{READ}X=V1+\Delta VDLA$. V1 is equal to the pass voltage $V_{READ}X=V1$ applied during verify so that no compensation will be applied. $\Delta VDLA$ is an offset that increases $V_{READ}X$ by an amount over V1 to effect a compensation. $V_{READ}X$ may include several voltages to apply different levels of compensation based on the state of the adjacent memory cell.

In general, $V_{READ}X$ is dependent on the programmed condition of an adjacent memory cell on WLn+1. The more programmed the neighboring state, the more perturbation and the more compensation that is used. The example shows two possible compensation levels coded by one bit. Additional read pass voltages can be applied to WLn+1 to provide additional compensation levels.

$V_{READ}X=V1$ corresponds to a situation where the selected memory cell is sensed with no compensation. The pass bias $V_{READ}X$ is the same as in program verify at V1. If an adjacent memory cell is below a predetermined programmed threshold, the results of sensing the selected memory cell while applying V1 to WLn+1 are selected. When the adjacent cell at WLn+1 is less programmed with the total perturbation below the predetermined threshold, no compensation is employed (DLA value "1"). Therefore the biasing of WLn+1 is the same as in the program verify case with $V_{READ}X=V1$.

Compensation is effected by using a larger pass bias by raising $V_{READ}X$ from V1 to V1+$\Delta VDLA$. When the neighboring cell is in a more programmed state, with the total perturbation above a predetermined threshold for example, the results of sensing the selected memory cell while applying V1+$\Delta VDLA$ are selected. When the adjacent cell at WLn+1 is more programmed with the total perturbation above the predetermined threshold, the results including compensation are used (DLA value '0'). In this case, compensation is effected by raising the biasing on WLn+1 by a predetermined amount with $V_{READ}X=V1+\Delta VDLA$.

While a DLA read has been illustrated with one bit correction having two compensation levels, it is clear that more accurate sensing at WLn+1 can be used to provide more compensation levels that will render the compensation more precise. As described earlier with the DLA sensing scheme, the selected word line WLn and the adjacent word line WLn+1 are both read. The states or conditions of cells on WLn+1 are first determined by first sensing WLn+1 in order to know which sensing results to use for each selected memory cell on WLn. For a finer correction based on multiple programmed levels of the adjacent cells, WLn+1 is sensed multiple times, each time for one of the multiple levels.

It is noted that the unselected word lines other than WLn+1 may receive the same $V_{READ}$ pass voltage as described above, or may receive different pass voltages. For example, the programmed word lines WL0-WLn-1 may receive a relatively higher pass voltage than the unprogrammed word lines WLn+2 through the last programmed word line.

Figure 11:
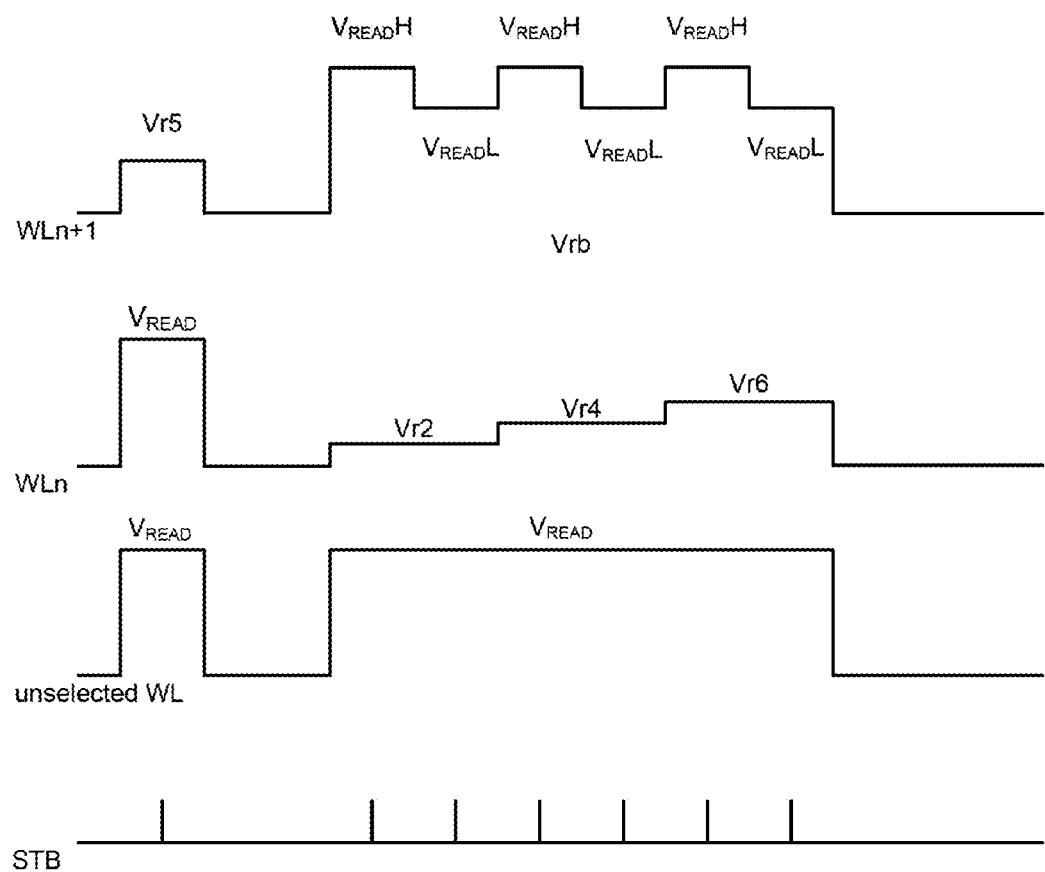
FIG. 11 is a timing diagram depicting bias conditions during a compensated read for multiple states.

FIG. 11 is a timing diagram depicting the bias conditions under a DLA scheme for sensing multiple states at the selected word line. A single compensation bit (DLA value) is used to encode two compensation levels to be applied based on the condition of an adjacent memory cell on WLn+1. In this particular example, WLn+1 is first read by sensing at a single read reference voltage Vr5 to determine a condition of each memory cell at WLn+1. This sense operation will discriminate each cell of WLn+1 as within a first set of states including S0-S4 or a second set of higher states including S5-S7. The unselected word lines including WLn receive $V_{READ}$ while sensing at WLn+1. As noted earlier, additional read reference voltages may be applied to WLn+1 to determine more precise state information which can be encoded as additional bits in a DLA value.

After sensing at WLn+1, reading for WLn begins. In the depicted example, WLn receives three read reference voltages Vr2, Vr4, and Vr6 that may be used to read a middle page of data in a three-bit per cell encoding scheme as shown in FIG. 7F.

To provide the two compensation levels denoted by the DLA values from WLn+1, two pass voltages are applied to WLn+1 when sensing for each state. A high pass bias $V_{READ}H$ is applied, followed by a lower pass bias $V_{READ}L$. The high pass bias $V_{READ}H$ applied to WLn+1 is the same when sensing for each state by applying one high pass voltage. Similarly, the low pass bias $V_{READ}L$ applied to WLn+1 is the same when sensing for each state. Accordingly, $V_{READ}H$ followed by $V_{READ}L$ is applied to WLn+1 while applying Vr2 for state S2 to WLn. $V_{READ}H$ followed by $V_{READ}L$ is again applied to WLn+1 while applying Vr4 for state S4 to WLn. $V_{READ}H$ followed by $V_{READ}L$ is then applied to WLn+1 while applying Vr6 for state S6.

For each bit line where the DLA value is '0' indicating a high level of programming at WLn+1, the results of sensing while $V_{READ}H$ is applied to WLn+1 are used when sensing WLn. For each bit line where the DLA value is '1' indicating a lower level of programming at WLn+1, the results of sensing while $V_{READ}L$ is applied to WLn+1 are used when sensing WLn.

The effects of word line interference at WLn based on programming of WLn+1 may be dependent on the state of the memory cell being sensed at WLn. FIGS. 12-12F are distributions illustrating that the effects of word line interference can also be dependent on the state of the memory cell that is being read, in addition to the programmed condition of an adjacent memory cell. FIGS. 12A-12F depict a set of distributions that illustrate the fail bit count (FBC) for a set of memory cells along a word line as a function of an offset from the nominal read reference levels. The read reference voltages are set forth as shifts (e.g., DAC trim value) from their nominal levels in the middle of each respective graph. Additionally, the FBC counts are set forth individually for the state of the adjacent memory cell on WLn+1.

With reference to FIG. 12A for example, the FBC as a result of misreading state A cells in state B or state B cells in state A is depicted along the y-axis. The FBC is depicted as a function of the Vr2 voltage level along the x-axis. FIG. 12A illustrates that the FBC resulting from misreading state A cells as state B increases as the Vr2 read level is lowered (left in the graph). FIG. 12A also illustrates that the FBC resulting from misreading state B cells as state A increases as the Vr2 read level is increased (right in the graph).

Line 501 shows the FBC when the adjacent memory cell on WLn+1 is in state E (S0), line 503 shows the FBC when the adjacent memory cell is in state S1, line 505 shows the FBC when the adjacent memory cell is in state S2, line 507 shows the FBC when the adjacent memory cell is in state S3, line 509 shows the FBC when the adjacent memory cell is in state S4, line 511 shows the FBC when the adjacent memory cell is in state S5, line 513 shows the FBC when the adjacent memory cell is in state S6, and line 515 shows the FBC when the adjacent memory cell is in state S7. The lines, and similar lines for each of the other states shown in FIGS. 12B-12F, shows a clear non-linear dependence on the programmed condition of the adjacent memory cell on WLn+1. As the state increases (corresponding to higher threshold voltages), a significantly higher shift in the FBC can be seen.

FIG. 12B shows the FBC as a result of misreading at the Vr3 level between states B and C, FIG. 12C shows the FBC as a result of misreading at the Vr4 level between states C and D, FIG. 12D shows the FBC as a result of misreading at the Vr5 level between states D and E, FIG. 12E shows the FBC as a result of misreading at the Vr6 level between states E and F, and FIG. 12F shows the FBC as a result of misreading at the Vr7 level between states F and G.

Referring now to FIGS. 12A and 12F for comparison, it can be seen in the areas denoted by 516 and 518 that the effects of word line interference are more pronounced at the selected word line when sensing at the lower state levels (e.g., Vr2) than when sensing at the higher state levels (e.g., Vr7). As shown in areas 516 and 518, the FBC is more dependent on the programmed state of the adjacent memory cell (separation between lines) when sensing at the lower Vr2 level, than when sensing at the higher Vr7 level. Area 518 shows a smaller upshift in the FBC with higher programmed conditions of the adjacent memory cells. Referring to each of FIGS. 12A-12F, the upshift decreases from state S1 of the selected memory cell to the state S7. This disparity may result from the parasitic cell effects after programming an adjacent memory cell. After programming WLn+1, it may be more difficult to turn on a memory cell at WLn that is in a lower state.

Figure 13A:
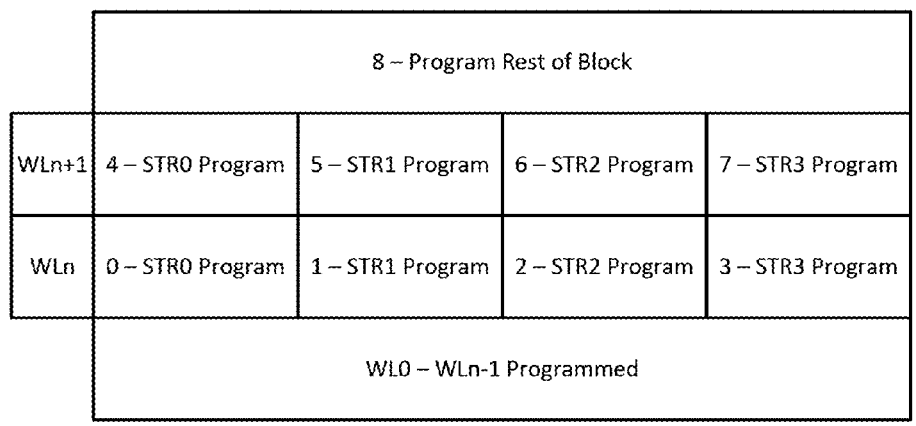
FIG. 13A is a block diagram describing an example of a program sequence.
Figure 13B:
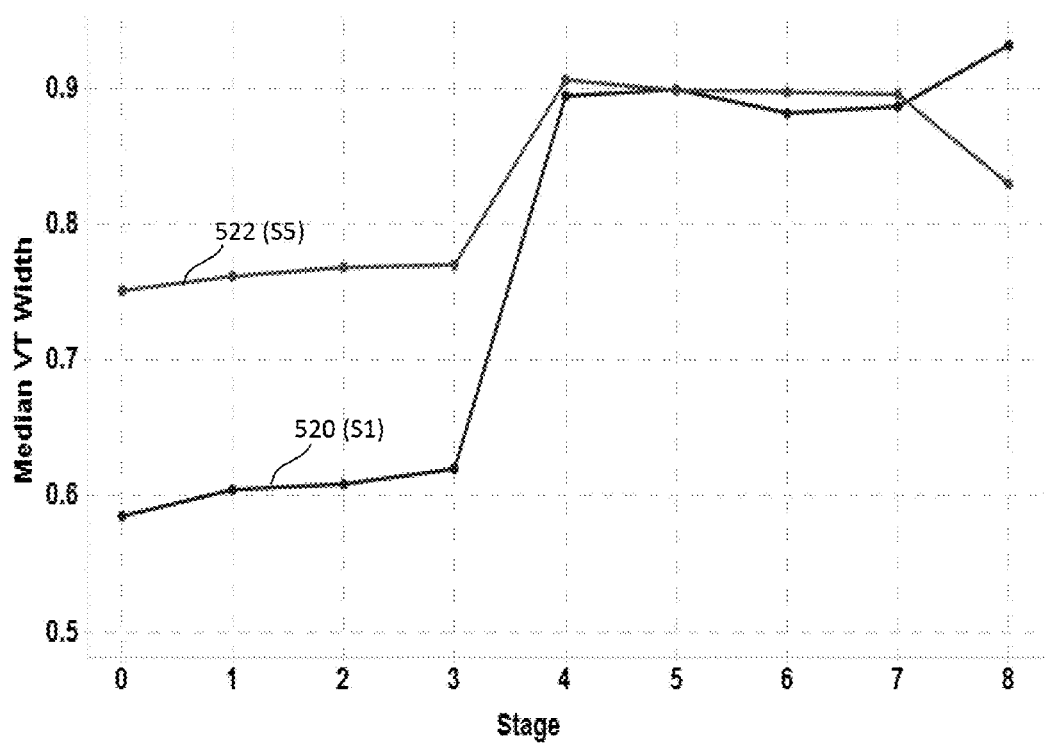
FIG. 13B is a graph depicting the threshold voltage window for memory cells after various states of the program sequence in FIG. 13A.

The aforementioned effects are summarized in an example shown in FIGS. 13A and 13B. FIG. 13A is a block diagram depicting a programming sequence for an example block. FIG. 13B is a graph depicting the threshold voltage window for memory cells of a selected word line WLn at the various stages of programming depicted in FIG. 13A. The VT window is set forth as a median VT window. Specifically, FIG. 13B includes a first line 520 showing the threshold window of the memory cells of the selected word line WLn that are in state S1, and a second line 522 showing the threshold window of the memory cells of the selected word line WLn that are in state S5.

Word lines WL0 through WLn−1 are first programmed, before programming begins for the selected word line WLn. Programming then begins for word line WLn with a first programming strobe STR0 for WLn. After STR0, the voltage window for cells in state S1 and cells in state S5 on WLn are around the 0.6 and 0.75 levels respectively. The windows for levels of both sets of memory cells increase slightly as the three additional programming strobes STR1, STR2, and STR3 are applied to WLn.

After applying the first programming strobe STR0 to WLn+1 (stage 4), the threshold voltage window for cells in state S5 at WLn increases to around 0.9V. The threshold voltage window for cells in state S1 also increases to around 0.9V. The VT windows remain roughly at these levels as WLn+1 completes programming. After programming the rest of the block, the VT window for cells in state S5 drops to just above 0.8V, while the VT window for cells in state S5 increases to about 0.95V. As lines 520 and 522 illustrate, the higher state S5 shows less threshold voltage widening as a result of programming WLn+1.

In accordance with one embodiment, a variable pass bias for an adjacent memory cell that is dependent on the state being sensed at the selected word line is provided. The pass bias corresponding to a particular condition of an adjacent memory cell for a compensated read varies based on the state being sensed at the selected word line WLn. As shown in FIGS. 12A-12F, the amount of threshold voltage shift for a selected memory cell is greater when the selected cell is in lower programmed states corresponding to lower threshold voltages. Accordingly, a compensation pass bias applied to the adjacent word line for providing compensation to the selected word line can be lowered or reduced for higher level states. For example, a high pass bias corresponding to a memory cell at WLn+1 programmed to a relatively high threshold voltage can be lowered as the state being sensed (or the read reference voltage) at the selected word line increases. The reduced pass voltage provides less shift in the threshold voltage to memory cells at WLn, accounting for the smaller shift due to floating gate coupling that is experienced by these cells. Additionally, a low pass voltage corresponding to a lower programmed memory cell at WLn+1 can be increased as the state being sensed increases.

Figure 14:
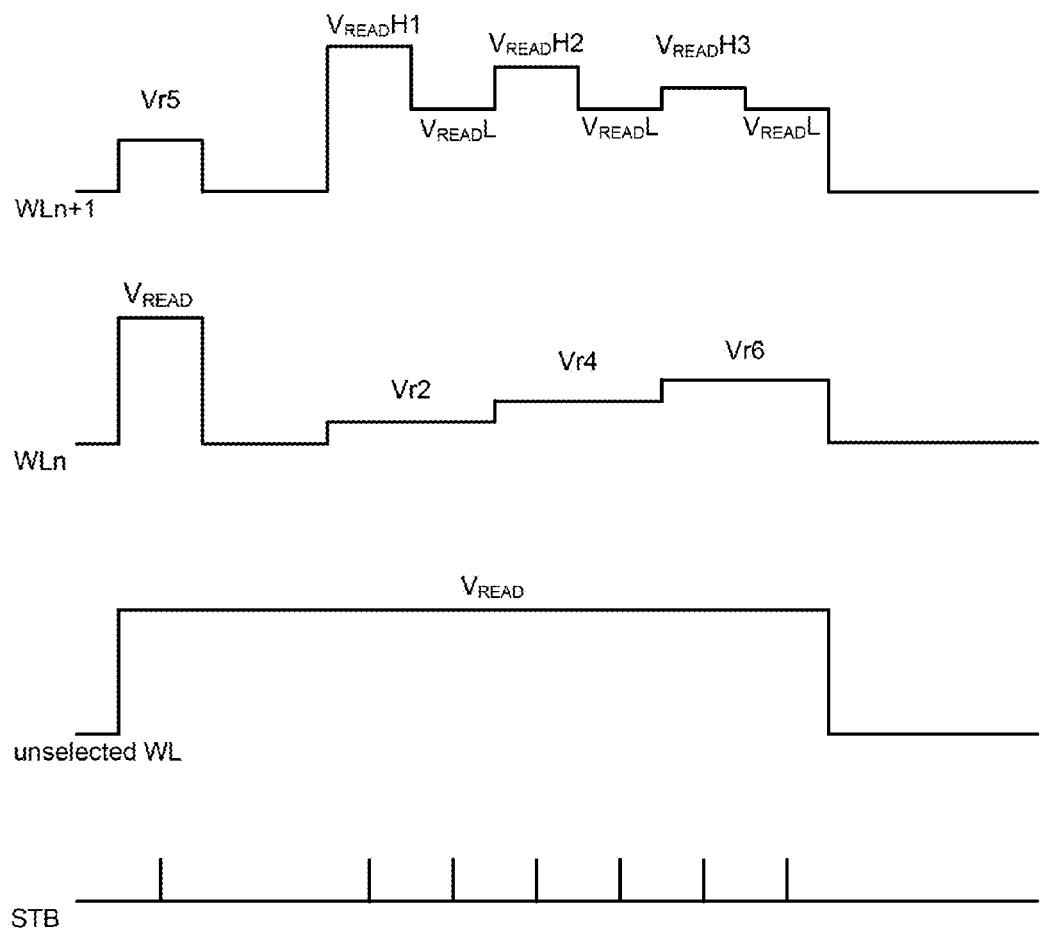
FIG. 14 is a timing diagram depicting bias conditions including a variable compensation pass bias for a particular condition of an adjacent cell based on the state being sensed.

FIG. 14 is timing diagram depicting a set of voltage signals applied for reading according to one embodiment that includes adjusting at least one compensation pass bias that is applied to an adjacent word line, based on the state or level being sensed at the selected word line. The compensation bias corresponding to the same condition of memory cells at WLn+1 is adjusted based on the state being sensed at the selected word line. The signals applied to the selected word line WLn, an adjacent unselected word line WLn+1, and each remaining unselected word line are depicted. A strobe signal that initiates sensing by the sense module is also depicted.

The first part of the read operation for WLn includes reading the adjacent word line WLn+1 using at least one sense operation. For sensing at the adjacent word line WLn+1, the selected word line is raised to a pass voltage $V_{READ}$ so that all the memory cells thereon operate as pass gates. The other unselected word lines are also raised to $V_{READ}$ so that the corresponding memory cells operate as pass gates.

The memory cells of the adjacent word line are read by applying one or more read reference voltages Vcgr to determine a condition of each memory cell. In this particular example, a single read reference voltage is applied to determine whether each cell of WLn+1 is programmed to a relatively high threshold voltage or not. Vr5 is applied to sense each cell as having a threshold voltage above or below the Vr5 level. This will indicate whether the cell is in a first set of states S0-S4 or in a second set of states S5-S7 in a three bit per cell example, but will not render the precise state of the memory cell. The read reference voltage Vr5 is presented as an example, as reading the memory cells of WLn+1 can use any read reference voltage to discriminate between cells having higher threshold voltages than other memory cells.

In other examples, additional read reference voltages may be applied for a more accurate determination of the condition or level of programming of the cells of WLn+1. The actual state of the cells of WLn+1 or a smaller subset of states that the cells may be in can be determined. The condition of each memory cell on WLn+1 is stored as a DLA value. For example, a binary indication of '1' or '0' may be used as a compensation bit to indicate whether a cell is above or below a particular reference level (in states 0-4 or states 5-7). The DLA value for each adjacent cell may include additional bits to more accurately indicate the condition of each memory cell. In one example, the DLA values may indicate the actual state of each adjacent memory cell. The DLA values can be stored in data latches of the sense module.

Reading the selected word line begins after reading the adjacent word line. The selected word line is sensed multiple times at each reference voltage level. In this example, reading for a middle page of data using the encoding scheme of FIG. 7F is shown. A set of sense operations (or sub-reads) are first performed at the Vr2 reference voltage level, followed by a set of sense operations at the Vr4 reference voltage level, followed by a set of sense operations at the Vr6 reference voltage level.

The adjacent word line WLn+1 receives a high pass bias followed by a low pass bias when reading at each reference voltage level. The high pass bias corresponds to a first possible condition of memory cells on WLn+1 and the low pass bias corresponds to a second possible condition of memory cells on WLn+1. The high pass bias couples more positive charge to the selected memory cells which shifts their apparent threshold voltage in the negative direction when compared with application of a standard $V_{READ}$ pass voltage, and when compared with application of the low pass bias. Accordingly, the results of sensing with the high pass bias applied to WLn+1 are used when the adjacent memory cell is within the second set of states S5-S7 and the results of sensing with the low pass bias applied to WLn+1 are used when the adjacent memory cell is within the first set of states S0-S4.

The state S2 read reference voltage Vr2 is first applied to the selected word line and two sensings are performed. Each sensing is triggered by raising the STB signal. The first sensing is performed with the high pass voltage $V_{READ}H1$ applied to WLn+1 and the second sensing is performed with the low pass voltage $V_{READ}L$ applied to WLn+1. For each selected memory cell at WLn, the results of the first sensing are stored when the neighboring memory cell at word line WLn+1 is in states S5-S7. The results of the second sensing are stored when the neighboring memory cell at word line WLn+1 is in states S0-S4.

The state S4 read reference voltage Vr4 is next applied to the selected word line and two additional sensings are performed. The first sensing is performed with the high pass voltage $V_{READ}H2$ applied to WLn+1 and the second sensing is performed with the low pass voltage $V_{READ}L$ applied to WLn+1. The results of the first sensing are stored when the neighboring memory cell at word line WLn+1 is in states S5-S7. The results of the second sensing are stored when the neighboring memory cell at word line WLn+1 is in states S0-S4.

$V_{READ}H2$ is lower or less than $V_{READ}H1$. The difference between $V_{READ}H2$ and $V_{READ}H1$ can be selected for a correspondence with the decrease in threshold voltage shift that can be expected for memory cells of WLn when sensing for memory cells that are in a higher state level corresponding to Vr4, than when sensing for memory cells at the lower Vr2 read reference voltage. For example, the difference may attempt to approximate the decreased shift that is seen in selected memory cells that are in states S4 or S5 versus those that are in states S2 or S3. The difference between the two levels may vary by implementation. For example, $V_{READ}H2$ and $V_{READ}H1$ may differ by 0.2 to 0.5V in one example. Other differences may be used.

The state S6 read reference voltage Vr6 is applied to the selected word line after applying Vr4. A first sensing is performed with the high pass voltage $V_{READ}H3$ applied to WLn+1 and the second sensing is performed with the low pass voltage $V_{READ}L$ applied to WLn+1. The results of the first sensing are stored when the neighboring memory cell at word line WLn+1 is in states S5-S7. The results of the second sensing are stored when the neighboring memory cell at word line WLn+1 is in states S0-S4.

$V_{READ}H3$ is lower or less than $V_{READ}H2$. The difference between $V_{READ}H3$ and $V_{READ}H2$ can be the same as or different than the difference between $V_{READ}H1$ and $V_{READ}H2$. As with $V_{READ}H2$, the level of $V_{READ}H3$ may be chosen so that the decreased coupling approximates to the decreased shift that is expected for selected memory cells of WLn that are in states S6-S7.

FIG. 14 depicts a single pass voltage $V_{READ}$ that is applied to all other unselected word lines. $V_{READ}$ is less than the high compensation voltages $V_{READ}H1$, $V_{READ}H2$, and $V_{READ}H3$ in one embodiment. In one embodiment, $V_{READ}H3$ is equal to $V_{READ}$. $V_{READ}$ is greater than the low pass voltage $V_{READ}L$ in one embodiment. In one embodiment, $V_{READ}L$ is equal to V1 that is applied to WLn+1 during program verification. In this manner, no compensation will be effected when $V_{READ}L$ is applied. In other embodiments, different pass voltages may be applied to some unselected word lines. For example, the programmed source side word lines may receive a higher pass voltage than the unprogrammed drain side word lines.

In FIG. 14, the low pass bias $V_{READ}L$ remains the same when sensing at each of the reference voltages Vr2, Vr4 and Vr6. In another embodiment, $V_{READ}L$ may be adjusted when sensing at different read reference voltages. For example, $V_{READ}L$ may be increased alone or in combination with lowering $V_{READ}H$.

Figure 15:
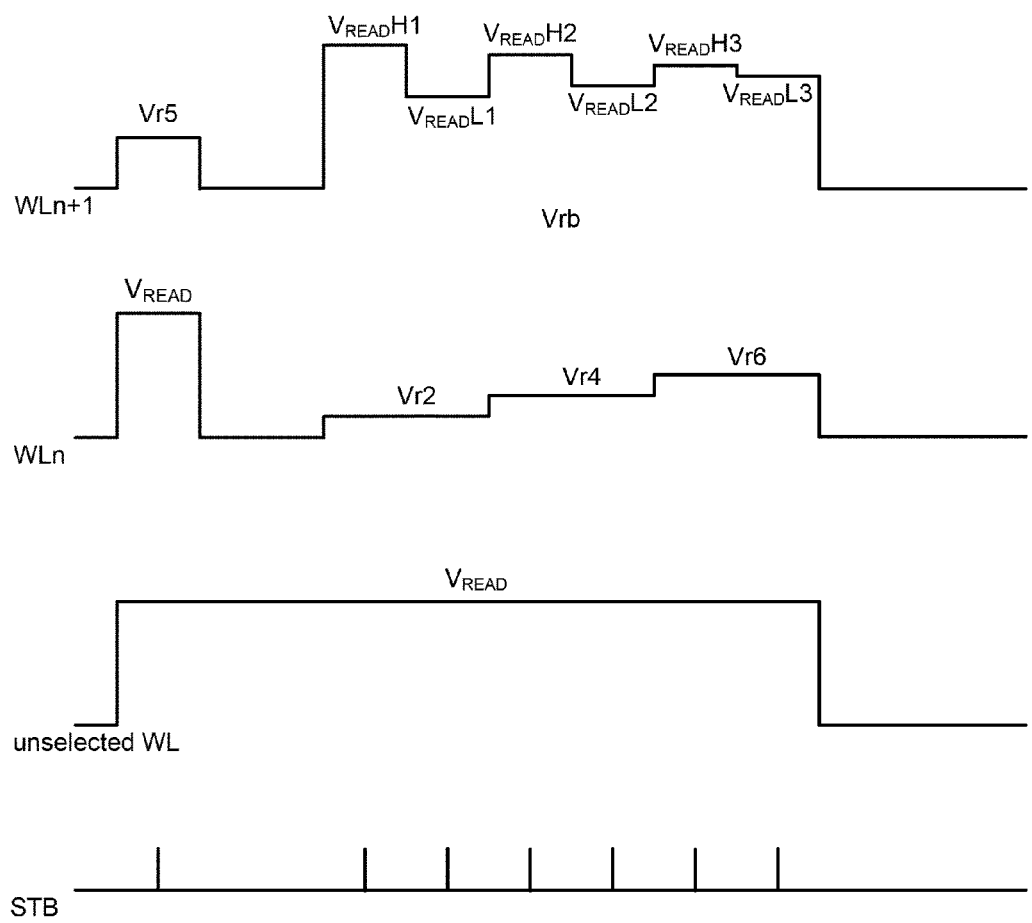
FIG. 15 is a timing diagram depicting bias conditions including multiple variable compensation pass biases.

FIG. 15 depicts an example where the low pass $V_{READ}L$ is increased as sensing progresses from lower to higher level states corresponding to higher threshold voltages. To account for larger shifts in threshold voltage at WLn when sensing lower Vt cells, the low pass bias $V_{READ}L$ is set to a lower level when sensing lower level states. This effects a compensation when sensing at the lower read reference voltages that is larger than a compensation or no compensation that is applied when sensing at a higher read reference voltage for higher Vt cells.

The first high pass voltage $V_{READ}H1$ is applied to the adjacent word line WLn+1 while applying the read reference voltage Vr2. After applying $V_{READ}H1$, a first low pass voltage $V_{READ}L1$ is applied to WLn+1. As earlier described, the high pass bias $V_{READ}H$ is greater than the nominal $V_{READ}$ voltage applied to the other unselected word lines and the low pass bias $V_{READ}L$ is lower than the nominal $V_{READ}$ voltage. In one example as described, $V_{READ}L$ may be equal to V1 which is applied to the adjacent word line during program verification. If $V_{READ}L=V1$ is applied to WLn+1 during reading, no compensation is effected.

Accordingly, $V_{READ}L1$ is set at a level below V1 so that its application to WLn+1 when sensing at WLn will increase the apparent threshold voltage of the memory cells of WLn. By decreasing the $V_{READ}L1$ below the V1 level, a compensation is applied to WLn when sensing at Vr2. For bit lines having a DLA value of '1', the results of sensing with $V_{READ}L1$ applied are stored.

After applying Vr2 and sensing with $V_{READ}H1$ applied to WLn+1 and sensing with $V_{READ}L1$ applied to WLn+1, $V_{READ}H2$ is applied to WLn+1. After sensing with $V_{READ}H2$ applied and storing results for those bit lines with a DLA value '0', $V_{READ}L2$ is applied to WLn+1. $V_{READ}L2$ is greater than $V_{READ}L1$. By increasing the low pass bias as the state is increased, the apparent shift in threshold voltage for the memory cells of WLn is decreased. For bit lines having a DLA value of '1', the results of sensing with $V_{READ}L1$ applied are stored.

After applying Vr4 and sensing with $V_{READ}H2$ and sensing with $V_{READ}L1$, $V_{READ}H3$ is applied to WLn+1. After sensing with $V_{READ}H3$ applied and storing results for those bit lines with a DLA value '0', $V_{READ}L3$ is applied to WLn+1. $V_{READ}L3$ is greater than $V_{READ}L2$. By increasing the low pass bias again as the state is increased, the apparent shift in threshold voltage for the memory cells of WLn is again decreased. For bit lines having a DLA value of '1', the results of sensing with $V_{READ}L1$ applied are stored. In one embodiment, $V_{READ}L3$ is equal to V1 so that no compensation is effected when sensing. In one embodiment, $V_{READ}L3$ is equal to $V_{READ}L$ as shown in FIG. 14.

In FIG. 15, the high pass bias $V_{READ}H$ is lowered as the state or read reference voltage increases. The high pass bias is lowered as the low pass bias is increased. In another embodiment, the low pass bias $V_{READ}L$ may be increased when sensing for higher level states, without decreasing the high pass bias.

Figure 16:
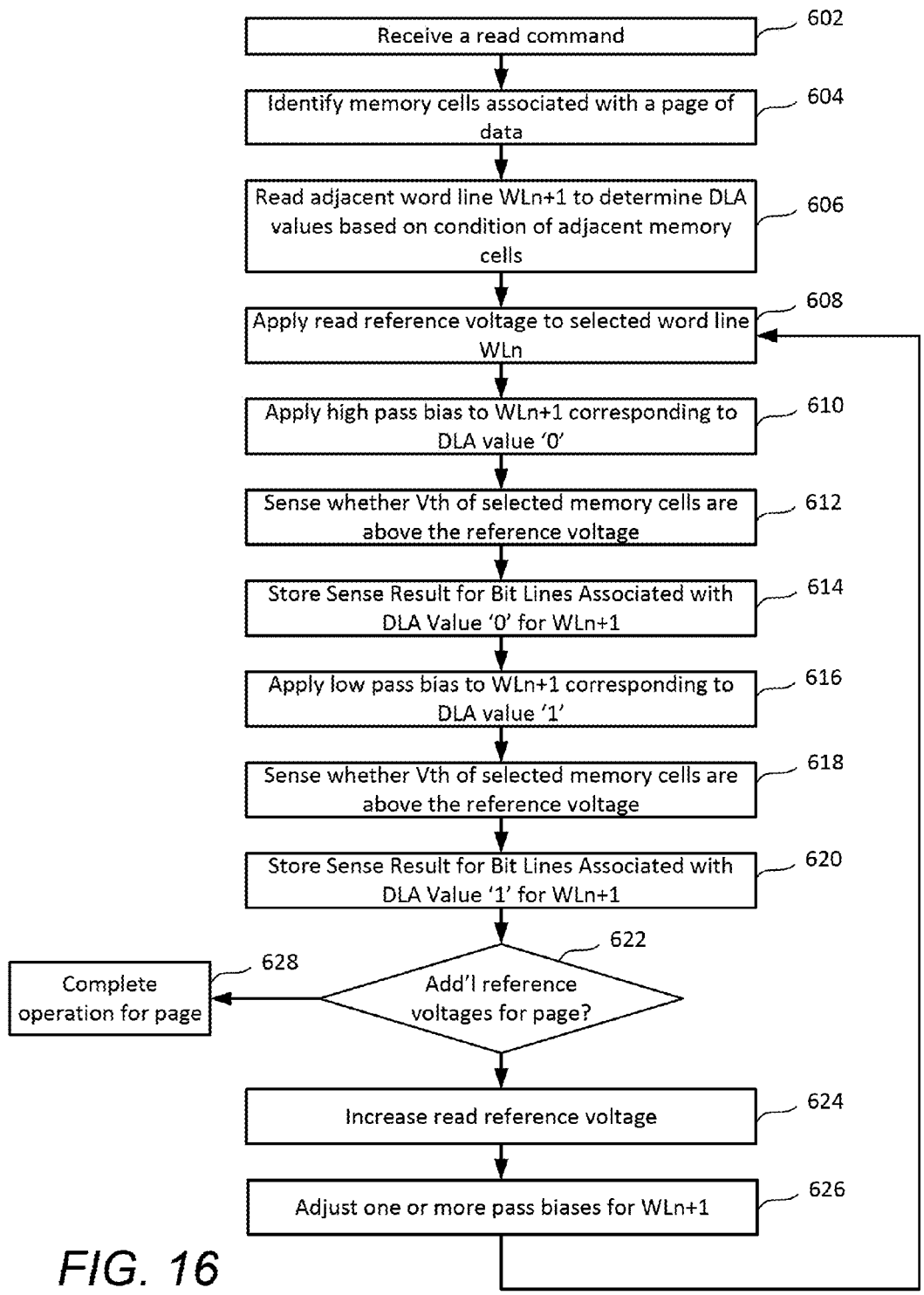
FIG. 16 is a flowchart describing a process of reading for a page of non-volatile memory cells in one embodiment.

FIG. 16 is a flowchart describing a processing of reading that includes reducing a pass voltage corresponding to a particular condition of an adjacent memory cell as a read reference voltage is increased for a selected word line. In one example, the process of FIG. 16 may be performed by a non-volatile storage system, such as non-volatile storage system 100 in FIG. 3. The process of FIG. 16 can be performed by state machine 112, control circuitry, controller 122 and/or any of the one or more control circuits described above.

At step 602, the system receives a read command from a host, or a read command passed internally within the storage system, for example between controller 122 and R/W circuits 128 and/or control circuitry 110. The read command may specify a memory address or a range of memory addresses to be read from the non-volatile storage system. At step 1004, a plurality of memory cells is identified in response to receiving the read or verify command. The plurality of memory cells may be associated with a page of data to be read or verified. The plurality of memory cells may be a set of memory cells connected to a common word line. The plurality of memory cells may include a first memory cell that is part of a first NAND string or another group of connected memory cells. The NAND memory array may include a NAND flash memory structure, such as a vertical NAND structure or a bit cost scalable (BiCS) NAND structure. By way of non-limiting example, the page of data may comprise 1 KB or 2 KB of data. Identifying the plurality of the memory cells can include identifying selected NAND strings, unselected NAND strings, selected word lines, and unselected word lines in one embodiment. For example, the selected word line may be a selected word line layer in a stacked 3D memory device, and the unselected word lines may include the remaining word line layers. Although the process of reading or verifying a single page of data is described, additional pages may be identified at step 604 and read or verified concurrently or in sequence with the described steps.

At step 606, a word line WLn+1 adjacent to a word line WLn selected for the read operation is read. For each memory cell of the adjacent word line, a DLA value is determined based on the condition of the cell. As earlier described, the DLA value may indicate a state of the adjacent memory cell or more general threshold voltage information, such as whether the memory cell has a threshold voltage above or below a particular read reference voltage. Step 606 may include determining which of a plurality of sets of states the memory cell is in by sensing at more than one read reference voltage, but at less than all of the read reference levels. Step 606 can include applying one or more of the same read reference voltages Vr1, Vr2, etc. used for a selected word line or can include applying one or more different read reference voltages. The DLA values may be stored in one or more data latches of a bit line associated with a selected memory cell and its adjacent memory cell.

At step 608, a read reference voltage is applied to the selected word line WLn for a particular state to be sensed. For example, read reference voltage Vr2 may be applied as the first reference level for sensing a middle page of data, or Vr1 may be applied as the first reference level for sensing a lower page of data.

At step 610, a high pass bias corresponding to a first DLA value (e.g., '0') is applied to the adjacent word line WLn+1. The high pass bias and DLA value are associated with a first condition of an adjacent memory cell. In one embodiment, step 610 can include applying $V_{READ}H1$ as shown in FIG. 14. Although not shown, step 610 may also include setting various pass voltages for the other unselected word lines. Step 610 may include applying a single pass voltage $V_{READ}$ ($V_{READ}H1 > V_{READ}$) to each other unselected word line. Step 610 may alternately include applying different pass voltages, such as a larger pass voltage for programmed word lines WL0-WLn−1 and a lower pass voltage for unprogrammed word lines WLn+2 through the end word line.

At step 612, the system senses whether the threshold voltages of the selected memory cells are above the reference voltage. For example, after biasing the memory for reading, the system can sense a current through each selected NAND string for a sense time.

At step 614, the system stores the results of sensing at step 612 contingent on the DLA value for each bit line. For bit lines having a data latch storing a DLA value of '0', indicating that the adjacent memory cell to the selected memory cell is a relatively high programmed state, the results are stored. The results at step 614 may be stored directly, indicating whether the selected memory cell was conductive or not. The results may also be combined with previous sensing results for the page and the combined data stored at step 614. In one embodiment, step 614 includes updating one or more data latches for a bit line if the selected memory cell is conductive during sensing at step 612 and the DLA value of the bit line is storing '0'. If the memory cell is non-conductive during sensing, the one or more data latches are not updated. For bit lines associated with a DLA value of '1, indicating that the adjacent memory cell is in a lower programmed state, any results of sensing at step 612 are ignored or discarded.

At step 616, a low pass bias corresponding to a second DLA value (e.g., '1') is applied to the adjacent word line WLn+1. The high pass bias and DLA value are associated with a second condition of an adjacent memory cell. In one embodiment, step 616 can include applying $V_{READ}H2$ as shown in FIG. 14. Step 616 may include setting various pass voltages for other unselected word lines.

At step 618, the system senses whether the threshold voltages of the selected memory cells are above the reference voltage. The system can sense a current through each selected NAND string during a specified sense time.

At step 620, the system stores the results of sensing at step 618 based on the DLA value for each bit line. For bit lines having a data latch storing a DLA value of '1', indicating that the adjacent memory cell to the selected memory cell is in a relatively low programmed state, the results are stored.

The results at step 620 may be stored directly, indicating whether the selected memory cell was conductive or not. The results may also be combined with previous sensing results for the page and the combined data stored at step 620. In one embodiment, step 620 includes updating one or more data latches for a word line if the selected memory cell is conductive during sensing at step 618 and the DLA value of the bit line is storing '1'. If the memory cell is non-conductive during sensing, the one or more data latches are not updated.

For bit lines associated with a DLA value of '0', indicating that the adjacent memory cell is in a higher programmed state, any results of sensing at step 618 are ignored or discarded. These cells were updated based on the results of sensing at step 612.

At step 622, the system determines whether there are additional reference voltages to be applied for the page. If additional reference voltages are to be applied, the system increases the read reference voltage at step 624 for the next sense operation. At step 626, the system adjusts one or more of the pass biases for the adjacent word line WLn+1. In one embodiment, the system reduces the high pass bias VpassH from a higher voltage $V_{READ}H1$ to $V_{READ}H2$ as shown in FIG. 14. The system may alternately or additionally increase the low pass bias VpassL. Further, additional variations may exist as hereinafter described where the high pass bias is increased for one or more higher read reference voltages.

After adjusting the one or more pass biases, the read process returns to step 608 to apply the next read reference voltage. After sensing at each read reference voltage multiple times using the different pass biases, the process completes at step 628.

As earlier described, the use of a binary DLA value and two pass biases is provided only as an example. In other variations, the adjacent word line may be read by sensing using additional read reference voltages to determine more accurate program level information that can be stored with additional bits for the DLA value. In such a case, additional pass biases will be applied for corresponding to the additional DLA values indicating the more accurate state or program level information.

It is noted that the steps of FIG. 16 may be performed in different orders than those presented. For example, the low pass bias may be applied prior to the high pass bias on WLn+1 when applying each read reference voltage to WLn. Moreover, the read reference voltages may be applied in a different order by staring with the highest read reference voltage for a page (e.g., Vr6), and then decreasing the read reference voltage 1024. In such a case, the high pass bias may be increased as the read reference voltage is decreased and/or the low pass bias increased.

Figure 17:
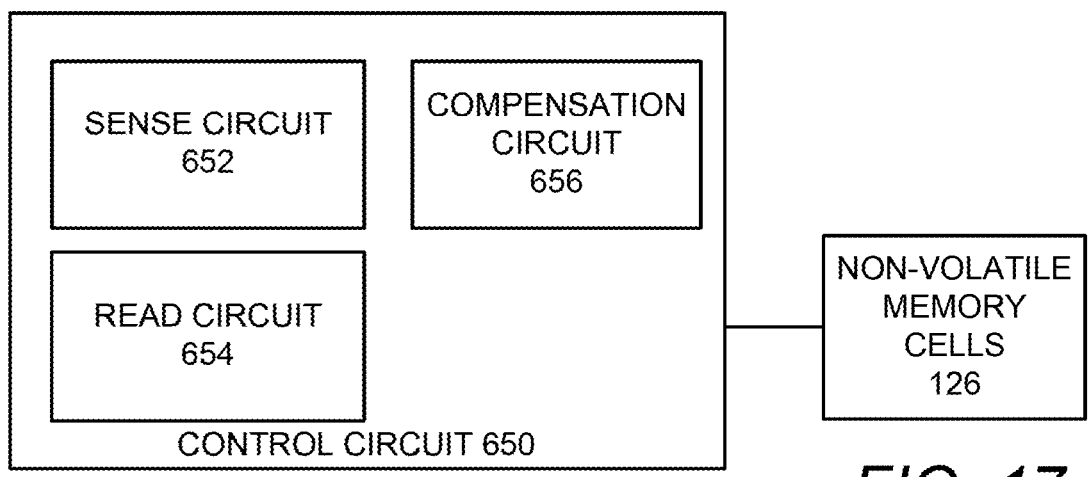
FIG. 17 is a block diagram of a memory device in one embodiment.

FIG. 17 is a block diagram of one example of a set of components that can perform the process of FIG. 16. FIG. 17 is an example of components that can be used to read a selected word line while providing to an adjacent word line a variable read pass bias corresponding to a particular condition of adjacent memory cells of the adjacent word line.

FIG. 17 depicts control circuit 650 in communication with non-volatile memory cells 126. In one embodiment, memory cells 126 can include memory cells in a two dimensional structure or three dimensional structure (e.g., such as the structure depicted in FIGS. 4A-F). Any of various non-volatile technologies known in the art can be used to implement memory cells 126.

Control circuit 650 includes sense circuit 652, read circuit 654, and compensation circuit 656. Sense circuit 652 is connected to the memory cells and is configured to perform a sense process as part of reading or verifying for the memory cells, as described herein. In one embodiment, sense circuit 652 performs step 606 of FIG. 16. In another embodiment, step 606 may be performed by read circuit 654. Sense circuit may be used for sensing as parting of reading, verifying, monitoring, probing, or any other process that determines a memory cell's state or condition. Sense circuit 652 is part of read circuit 654 in one embodiment. In one embodiment, sense circuit 652 is configured to determine a condition of a first unselected memory cell adjacent to a selected memory cell prior to sensing for the selected memory cell.

Read circuit 654 is configured to read groups of memory cells, such as a page of data from a page of memory cells in non-volatile memory cells 126. Read circuit 654 is one example of a reading means. Various means for reading non-volatile memory cells may be used to determine a programmed state of a selected memory cell may be used. The reading means may include a dedicated circuit, such as a dedicated circuit within control circuit 650 in one example. The reading means may also or alternately include software control means implemented with a process or logic circuitry for example. The read circuit may be a part of or include sense circuit 652 and/or compensation circuit 656. In one embodiment, the reading means performs steps 602, 604, 608, 612, 614, 618, 620, 622, 624, and 628 of FIG. 16 for a read operation. In another embodiment, the reading means also performs steps 606, 610, 616, and 624.

Read circuit 654 is configured to read one or more selected memory cells by performing a plurality of sense operations for a plurality of states to sense a programmed state of one or more multi-state memory cells. The reading means may include reading means for performing multiple read operations to read various pages of data from a selected set of memory cells. The reading means may include means for applying one or more sets of read reference voltages to the selected memory cells in order to determine a programmed state of the selected memory cells. The reading means may apply to a selected word line one or more of a plurality of read reference voltages associated with a particular page of data in association with a read operation. The read circuit may perform for a selected memory cell or word line a plurality of sense operations for a plurality of states. The plurality of sense operations for a particular state of the selected memory cell correspond to different conditions of an adjacent memory cell.

The read circuit may use a first reference voltage during a first sense operation and a second sense operation for a first state. The read circuit is configured to sense the selected memory cell using a second reference voltage during a third sense operation and a fourth sense operation for a second state where the second reference voltage is greater than the first reference voltage.

Compensation circuit 656 is configured to apply one or more compensation pass biases to one or more unselected memory cells or word lines while a selected word line or memory cell is sensed. Compensation circuit 656 is one example of a compensation means, also referred to as a means for adjusting a pass voltage. Various means for compensation or adjusting a pass voltage may be used. The compensation means may include a dedicated circuit, such as a dedicated circuit within control circuit 650 in one example. The compensation means may also or alternately include software control means implemented with a process or logic circuitry for example. The compensation circuit may be a part of or include read circuit 654 and/or sense circuit 652. In one embodiment, the compensation means performs steps 610, 616, and 626 of FIG. 15 for a read operation Compensation circuit 656 is configured to adjust a pass bias applied to an adjacent unselected memory cell during each of a plurality of sense operations for a selected memory cell. The pass bias may include a first pass voltage for a first condition of the first unselected memory cell during sensing for a first state and a second pass voltage for the first condition during sensing for a second state that is different from the first state. The first pass voltage is greater than the second pass voltage. The compensation circuit may be configured to drive the adjacent memory cell with the first pass voltage for the first sense operation, a third pass voltage for the second sense operation, and the second pass voltage for the third sense operation. The third pass voltage is less than the second pass voltage and the first pass voltage.

In one embodiment, compensation circuit 656 sequentially applies to a first unselected memory cell adjacent to a selected memory cell a first set of pass voltages for a plurality of sense operations for a first state and a second set of pass voltages for a plurality of sense operations for a second state. The first set of pass voltages includes a first pass voltage that is higher than each pass voltage of the second set.

In one embodiment, compensation circuit 656 sequentially applies a high pass bias and a low pass bias to an adjacent word line for sensing a first state based on direct look ahead values associated with adjacent memory cells of an adjacent word line. The compensation circuit reduces the high pass bias for sensing each subsequent state that has higher threshold voltages than the first state.

In one embodiment, the compensation circuit includes means for adjusting a pass voltage applied to a first unselected memory cell during each of a plurality of sense operations. A first pass voltage for a first condition of the first unselected memory cell during sensing for a first state is greater than a second pass voltage for the first condition during sensing for a second state that is associated with higher threshold voltages than the first state.

FIG. 18 is a table depicting a set of bias conditions for an adjacent word line WLn+1 when reading a group of memory cells connected to a selected WLn. FIG. 18 lists the seven read reference voltages Vr1-Vr7 that are applied to the selected WLn. For each read reference voltage, the rows of the table correspond to each of the potential states of a memory cell on adjacent word line WLn+1. For each state of a memory cell on WLn+1, the table lists the pass voltage applied to WLn+1 for which the results of sensing on WLn will be used.

The example in FIG. 18 continues with an example where the states of the adjacent memory cells are divided into two sets of states representing two conditions for an adjacent memory cell. The lower level states S0-S4 are denoted as Zone 1 and the higher level states S5-S7 are denoted as Zone 2.

When an adjacent memory cell is in one of the states of Zone 1, the results of sensing at WLn while applying the low pass bias will be used. In this example, a single low pass bias is used. When applying all of the read reference voltages, the same low pass voltage $V_{READ}L$ is applied to WLn+1. Thus, the results of sensing while applying $V_{READ}L$ to WLn+1 will be used when an adjacent memory cell of WLn+1 is in any one of the states 0-4. For example, when applying the read reference voltage Vr4 to WLn, the results of sensing while applying $V_{READ}L$ to WLn+1 will be selected.

When an adjacent memory cell is in one of the states of Zone 2, the results of sensing at WLn while applying the high pass bias to WLn+1 will be used. The high pass bias for WLn+1 is adjusted based on the state being sensed at the selected word line WLn. In this example, the states or read reference voltages applied to WLn are divided into four groups with three borders defining the groups. A first border $V_{READ}H\_border1$ between read reference voltages Vr1 and Vr2 defines a first group including Vr1. A second border $V_{READ}H\_border2$ between read reference voltages Vr3 and Vr4 defines a second group including Vr2 and Vr3. A third border $V_{READ}H\_border3$ between read reference voltage Vr5 and Vr6 defines a third group including Vr4 and Vr5, and defines a fourth group including Vr6 and Vr7.

When applying the read reference voltage Vr1, the high pass voltage $V_{READ}H1$ is applied to WLn+1 for the high pass bias. The results of sensing at Vr1 while applying $V_{READ}H1$ to WLn+1 will be used when an adjacent memory cell of WLn+1 is in any of states S5-S7. When applying the read reference voltages Vr2 or Vr3, the high pass voltage $V_{READ}H2$ is applied to WLn+1 for the high pass bias. The results of sensing at Vr2 or Vr3 while applying $V_{READ}H1$ to WLn+1 will be used when an adjacent memory cell of WLn+1 is in any of states S5-S7. When applying the read reference voltage Vr4 or Vr5, the high pass voltage $V_{READ}H3$ is applied to WLn+1 for the high pass bias. The results of sensing at Vr4 or Vr5 while applying $V_{READ}H3$ to WLn+1 will be used when an adjacent memory cell of WLn+1 is in any of states S5-S7. When applying the read reference voltage Vr6 or Vr7, the high pass voltage $V_{READ}H4$ is applied to WLn+1 for the high pass bias. The results of sensing at Vr6 and Vr7 while applying $V_{READ}H4$ to WLn+1 will be used when an adjacent memory cell of WLn+1 is in any of states S5-S7.

As earlier described, the number of zones for dividing the states of WLn+1 may be increased to generate more accurate DLA values representing more than two potential conditions of the adjacent memory cell. For example, each state may represent a zone such that the read of WLn+1 will determine the actual state of the adjacent memory cell so that eight conditions are used. Any number of zones or conditions may be used. A different pass bias will be used for each potential condition of an adjacent memory cell. For example, eight different pass biases for eight conditions may be used if each state is its own zone.

The use of four groups of read reference voltages to differentiate the high pass voltage that is used is provided as an example only. Any number of groups may be used. For example, two groups may be used so that $V_{READ}H1$ is used with read reference voltages Vr1, Vr2, Vr3, and Vr4, and $V_{READ}H2$ is used with read reference voltages Vr5, Vr6, and Vr7. In another example, seven groups could be used so that a different high pass bias is used for each read reference voltage.

As earlier described, the high pass bias for WLn+1 generally decreases as the state or read reference voltage applied to WLn increases. The amount of decrease can be the same between each transition, or different amounts of decrease may be used. It is also noted that the high pass bias may be increased as the read reference voltage increases in some cases. For example, $V_{READ}H1$ in FIG. 18 may be less than $V_{READ}H2$ in one example. $V_{READ}H3$ remains less than $V_{READ}H2$ and $V_{READ}H1$, while being greater than $V_{READ}H4$. Such a technique may be applied when the amount of shift in threshold voltage increases between sensing at Vr1 and Vr2 for example.

Typically blocks are programmed by programming one or more pages to each word line of the block in a word line order. Often, a block of memory cells is completely programmed during a single program operation. In some instances, however, only a portion of a block may be programmed. For example, the data for a write operation may only occupy a portion of one block or may occupy one or more complete blocks and a portion of another memory block. The blocks that have not been fully programmed are often referred to as partially programmed or open blocks, referring to an open word line as the last word line to be programmed for the block. Because an open WL does not have neighboring adjacent word line WLn+1 that is programmed after it, it will exhibit different behavior, particularly the effects of floating gate coupling when compared to closed word lines.

FIGS. 19A and 19B are graphs illustrating an example of the different behavior exhibited by closed and open word lines. FIGS. 19A and 19B depict the fail bit count (FBC) for a set of memory cells along a word line as a function of an offset from the nominal read reference levels. The read reference voltages are set forth as shifts (e.g., DAC trim value) from their nominal levels in the middle of each respective graph.

FIG. 19A sets forth the FBC count per WL for an open (top) and closed (bottom) word line when reading at the Vr2 read reference voltage. The FBC for the open WL is at its lowest when the Vr2 read reference voltage is shifted negatively by a significant amount (e.g., Vr2−2.5V). By contrast, the FBC for the closed WL is at its lowest when the Vr2 read reference voltage is not shifted from its nominal level. FIG. 19A illustrates that the memory cells of an open word line need to have their threshold voltages shifted up (in the positive direction) so that they are aligned with the optimum valley of the closed word line parameters.

FIG. 19B sets forth the FBC count per WL for an open (top) and closed (bottom) word line when reading at the Vr7 read reference voltage. The FBC for the open WL and the closed WL are both at their lowest when the Vr7 read reference voltage is not shifted from its nominal level.

FIGS. 19A and 19B illustrate that the WL interference is dependent on the state of the memory cell at the selected word line WLn. Lower threshold voltage memory cells on word line WLn should be shifted up in the positive direction more than the higher threshold voltage cells.

To more closely align the memory cells of an open word line with those of a closed word line, a state dependent low pass bias can be applied to an open word line in one embodiment. FIG. 20 is a table setting for the bias conditions for reading an open word line using read reference voltages Vr1-Vr7 for a 3-bit per cell device. In this case, a single low pass bias $V_{READ}L$ is applied to the adjacent word line WLn+1 without a corresponding high pass bias. Because the memory cells of WLn+1 are guaranteed to be in the erased state S0, only a single pass bias is applied to account for the only possible condition of the adjacent memory cell on WLn+1.

The low pass bias $V_{READ}L$ for WLn+1 is adjusted based on the state being sensed at WLn. Generally, the low pass bias is increased for sensing at higher level states corresponding to higher threshold voltages of the memory cells. A reduced low pass bias will shift the threshold voltage of the memory cells on WLn in the positive direction when compared with a larger low pass bias. Accordingly, increasing the low pass bias as the read reference voltage is increased will result in shifting the apparent threshold voltages of lower Vt cells by a larger amount than the shift in the apparent threshold voltages of higher Vt cells.

In this example, the states or read reference voltages applied to WLn are divided into four groups with three borders defining the groups as in FIG. 18. A first border $V_{READ}L\_border1$ between read reference voltages Vr1 and Vr2 defines a first group including Vr1. A second border $V_{READ}L\_border2$ between read reference voltages Vr3 and Vr4 defines a second group including Vr2 and Vr3. A third border $V_{READ}L\_border3$ between read reference voltage Vr5 and Vr6 defines a third group including Vr4 and Vr5, and defines a fourth group including Vr6 and Vr7.

When applying the read reference voltage Vr1, the low pass voltage $V_{READ}L1$ is applied to WLn+1 for the low pass bias. The results of sensing at Vr1 while applying $V_{READ}L1$ to WLn+1 will be used when an adjacent memory cell of WLn+1 is in any of states S0-S7. When applying the read reference voltages Vr2 or Vr3, the low pass voltage $V_{READ}L2$ is applied to WLn+1 for the low pass bias. The results of sensing at Vr2 or Vr3 while applying $V_{READ}L2$ to WLn+1 will be used when an adjacent memory cell of WLn+1 is in any of states S0-S7. When applying the read reference voltage Vr4 or Vr5, the low pass voltage $V_{READ}L3$ is applied to WLn+1 for the low pass bias. The results of sensing at Vr4 or Vr5 while applying $V_{READ}H3$ to WLn+1 will be used when an adjacent memory cell of WLn+1 is in any of states S0-S7. When applying the read reference voltage Vr6 or Vr7, the low pass voltage $V_{READ}L4$ is applied to WLn+1 for the low pass bias. The results of sensing at Vr6 and Vr7 while applying $V_{READ}L4$ to WLn+1 will be used when an adjacent memory cell of WLn+1 is in any of states S0-S7.

In one embodiment, sensing in the time domain can be used for sensing the condition of memory cells on WLn+1 and/or to apply a variable high and/or low pass bias to WLn+1.

In one embodiment, the programmed threshold voltages of storage elements on WLn+1 can be sensed in the time domain and encoded as time markers. This can be accomplished by a scanning sense voltage that increases with time. The time marker of a storage element indicates the time the storage element starts to conduct or equivalently when the scanning sense voltage has reached the threshold voltage of the storage element. The indicated threshold voltage of the storage element can be used to determine a DLA value for each adjacent memory cell on WLn+1.

After sensing WLn+1 using a scanning sense voltage, the page on WLn can be sensed while the same scanning voltage with an offset level is applied to WLn+1 for compensation. A storage element on WLn can be sensed at a time indicated by the time marker of an adjacent storage element on WLn+1, the time when the offset scanning voltage develops on an appropriate state-dependent compensating bias voltage on WLn+1.

Figure 21:
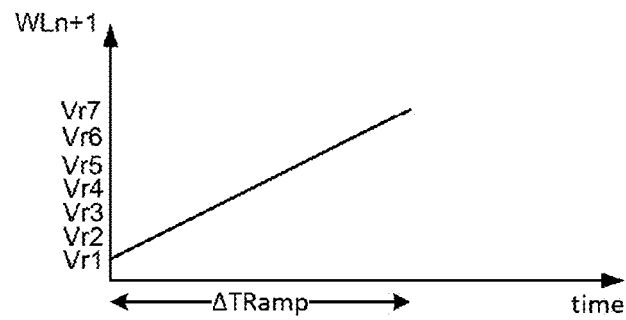
FIG. 21 is a timing diagram depicting a continuous scanning voltage for sensing a multi-level memory cell on an adjacent word line.

FIG. 21 depicts a continuous scanning voltage for sensing multiple levels (Vr1-Vr7) of a multi-level memory cell on the adjacent WLn+1. The scanning voltage Vscan is a linear ramp voltage having a range inclusive of all of the sense levels or read reference voltages to be applied to WLn+1. It has a constant ramp rate and scans through the range in a scanning period ΔTRamp.

Figure 22:
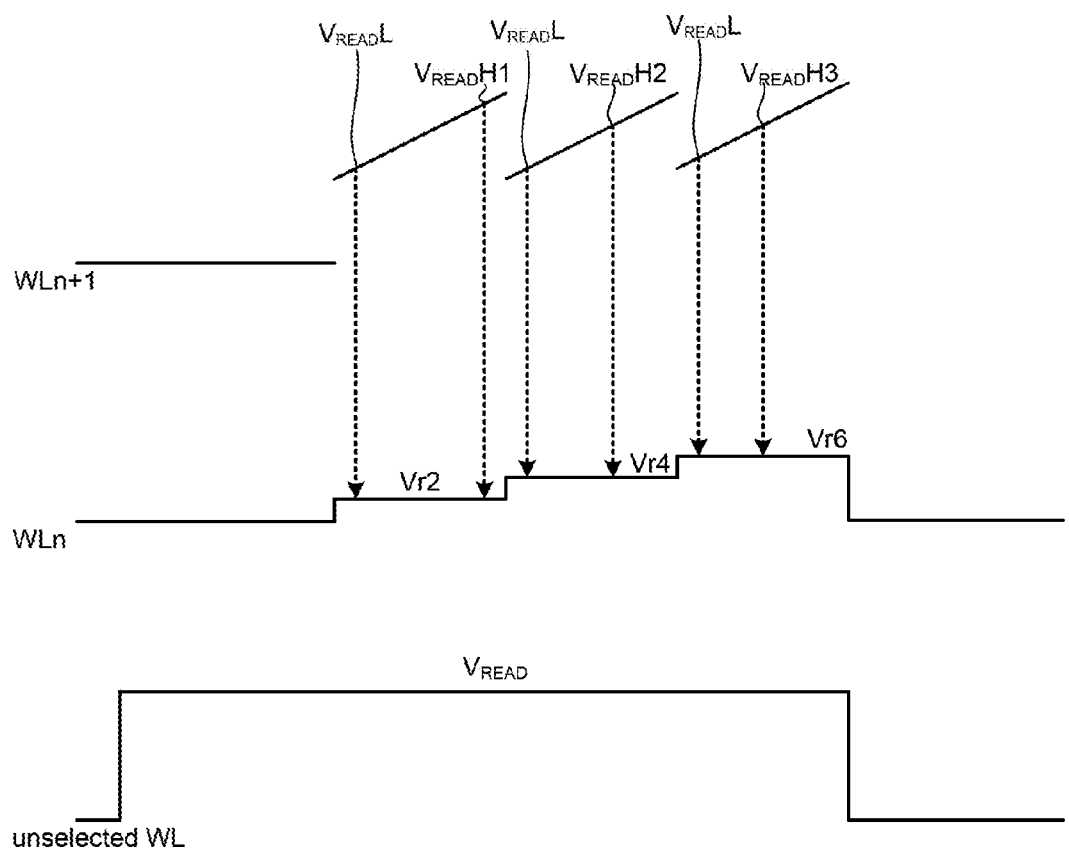
FIG. 22 is a timing diagram depicting a continuous scanning voltage for applying compensation pass biases.

FIG. 22 is a schematic timing diagram for sensing a page of data at WLn using a scanning voltage at the adjacent word line WLn+1. The page at the selected word line WLn is sensed while compensating for floating gate coupling from WLn+1. In the time-domain scheme, the condition or memory states of the memory cells at WLn+1 are detected as time markers. The DLA values in this example are the time markers.

The read reference voltage Vr2 is applied to WLn while the scanning voltage is applied to WLn+1. Vscan2 is inclusive of the low pass voltage $V_{READ}L$ and the high pass voltage $V_{READ}H1$. For those memory cells of WLn+1 having a time marker indicating that the cell is in a lower state (e.g., S0-S4), sensing is performed at WLn when Vscan2 is at the $V_{READ}L$ level. For those memory cells of WLn+1 having a time marker indicating that the adjacent cell is in a higher state (e.g., S5-S7), sensing is performed at WLn when Vscan2 is at the $V_{READ}H1$ level.

Similarly, Vr4 is then applied to WLn while again applying Vscan2 to WLn+1. For memory cells of WLn+1 having a time marker for the lower set of states, sensing at the adjacent cell of WLn is performed at $V_{READ}L$ and for memory cells having a time marker for the higher set of states, sensing at the adjacent cell is performed at $V_{READ}H2$. $V_{READ}H2$ is less than $V_{READ}H1$.

Finally, Vr6 is applied. For memory cells of WLn+1 having a time marker for the lower set of states, sensing at the adjacent cell of WLn is performed at $V_{READ}L$ and for memory cells having a time marker for the higher set of states, sensing at the adjacent cell is performed at $V_{READ}H3$. $V_{READ}H3$ is less than $V_{READ}H2$.

An apparatus according to one embodiment has been described including a plurality of memory cells a sense circuit configured to determine a condition of a first unselected memory cell adjacent to a selected memory cell prior to sensing for the selected memory cell. The apparatus includes a read circuit configured to perform for the selected memory cell a plurality of sense operations for a plurality of states. The plurality of sense operations for a particular state of the selected memory cell correspond to different conditions of the first unselected memory cell. The apparatus includes a compensation circuit configured to adjust a pass bias applied to the first unselected memory cell during each of the plurality of sense operations. The pass bias includes a first pass voltage for a first condition of the first unselected memory cell during sensing for a first state and a second pass voltage for the first condition during sensing for a second state that is different from the first state, the first pass voltage is greater than the second pass voltage.

An apparatus according to one embodiment has been described including a plurality of memory cells, a read circuit coupled to the plurality of memory cells, and a compensation circuit coupled to the plurality of memory cells. The read circuit reads a selected memory cell by using a first reference voltage for a first state and a second reference voltage for a second state, the first reference voltage is lower than the second reference voltage. The compensation circuit sequentially applies to a first unselected memory cell adjacent to the selected memory cell a first set of pass voltages for a plurality of sense operations for the first state and a second set of pass voltages for a plurality of sense operations for the second state. The first set of pass voltages includes a first pass voltage that is higher than each pass voltage of the second set.

A method has been described that includes sensing a selected word line coupled to a plurality of memory cells for a plurality of states, sequentially applying a high pass bias and a low pass bias to an adjacent word line for sensing a first state based on direct look ahead values associated with adjacent memory cells of the adjacent word line, and reducing the high pass bias for sensing each subsequent state that has higher threshold voltages than the first state.

An apparatus according to one embodiment has been described that includes a plurality of memory cells, means for determining a condition of a first unselected memory cell adjacent to a selected memory cell prior to sensing the selected memory cell, and means for reading the selected memory cell using a plurality of sense operations for a plurality of states. The plurality of sense operations for a particular state of the selected memory cell corresponds to different conditions of the first unselected memory cell. The apparatus includes means for adjusting a pass voltage applied to the first unselected memory cell during each of the plurality of sense operations. A first pass voltage for a first condition of the first unselected memory cell during sensing for a first state is greater than a second pass voltage for the first condition during sensing for a second state that is associated with higher threshold voltages than the first state.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:

1. An apparatus, comprising:
   a plurality of memory cells; and
   a sense circuit configured to determine a condition of a first unselected memory cell adjacent to a selected memory cell prior to sensing for the selected memory cell;
   a read circuit configured to perform for the selected memory cell a plurality of sense operations for a plurality of states, the plurality of sense operations for a particular state of the selected memory cell corresponding to different conditions of the first unselected memory cell; and
   a compensation circuit configured to adjust a pass bias applied to the first unselected memory cell during each of the plurality of sense operations, the pass bias including a first pass voltage for a first condition of the first unselected memory cell during sensing for a first state, a second pass voltage for a second condition of the first unselected memory cell during sensing for the first state, and a third pass voltage for the first condition during sensing for a second state that is different from the first state, the first pass voltage is greater than the second pass voltage and the third pass voltage.

2. The apparatus of claim 1, wherein:
   the read circuit is configured to sense the selected memory cell using a first reference voltage during a first sense operation and a second sense operation for the first state;
   the read circuit is configured to sense the selected memory cell using a second reference voltage during a third sense operation and a fourth sense operation for the second state, the second reference voltage is greater than the first reference voltage; and
   the compensation circuit is configured to drive the first unselected memory cell with the first pass voltage for the first sense operation, the second pass voltage for the second sense operation, and the third pass voltage for the third sense operation;
   the second pass voltage is less than the third pass voltage and the first pass voltage.

3. The apparatus of claim 2, wherein:
   the compensation circuit is configured to drive the first unselected memory cell with the first pass voltage while driving the selected memory cell with the first reference voltage and to drive the first unselected memory cell with the second pass voltage while driving the selected memory cell with the first reference voltage; and the compensation circuit is configured to drive the first unselected memory cell with the third pass voltage while driving the selected memory cell with the second reference voltage.

4. The apparatus of claim 3, wherein:

the compensation circuit is configured to drive the first unselected memory cell with the second pass voltage for the fourth sense operation while driving the selected memory cell with the second reference voltage.

5. The apparatus of claim 3, wherein:

the compensation circuit is configured to drive the first unselected memory cell with a fourth pass voltage for the fourth sense operation while driving the selected memory cell with the second reference voltage, the fourth pass voltage is higher than the second pass voltage and lower than the third pass voltage.

6. The apparatus of claim 2, wherein:

the sense circuit is configured to drive a set of unselected word lines not including the first unselected word line with a single pass voltage while sequentially applying the first pass voltage and the second pass voltage to the first unselected word line, the single pass voltage is less than the first pass voltage and the third pass voltage and is greater than the second pass voltage.

7. The apparatus of claim 2, wherein:

the sense circuit is configured to store a result of the first sense operation and the third sense operation when the first unselected memory cell is in the first condition; and the sense circuit is configured to store a result of the second sense operation and the fourth sense operation when the first unselected memory cell is in the second condition, the first condition is associated with higher threshold voltages of the first unselected memory cell than the second condition.

8. The apparatus of claim 1, further comprising:

a plurality of NAND strings including the plurality of memory cells, the plurality of NAND strings are arranged in a three-dimensional structure;

a plurality of bit lines coupled to the plurality of NAND strings; and a source line coupled to the plurality of NAND strings;

wherein the first unselected word line is adjacent to the select word line on a drain side of the selected word line and is programmed subsequent to the selected word line during programming.

9. An apparatus, comprising:

a plurality of memory cells;

a read circuit coupled to the plurality of memory cells, the read circuit reads a selected memory cell by using a first reference voltage for a first state and a second reference voltage for a second state, the first reference voltage is lower than the second reference voltage; and a compensation circuit coupled to the plurality of memory cells, the compensation circuit sequentially applies to a first unselected memory cell adjacent to the selected memory cell a first set of pass voltages for a plurality of sense operations for the first state and a second set of pass voltages for a plurality of sense operations for the second state, the first set of pass voltages includes a first pass voltage that is higher than each pass voltage of the second set and includes a second pass voltage that is lower than the first pass voltage.

10. The apparatus of claim 9, wherein:

the second set of pass voltages includes a third pass voltage, the third pass voltage is lower than the first pass voltage and higher than the second pass voltage;

the compensation circuit is configured to apply to the first unselected memory cell the first pass voltage for a first sense operation for the first state and the second pass voltage for a second sense operation for the first state; and the compensation circuit is configured to apply to the first unselected memory cell the third pass voltage for a third sense operation for the second state.

11. The apparatus of claim 10, wherein:

the second set of pass voltages includes the second pass voltage; and the compensation circuit is configured to apply the second pass voltage for a fourth sense operation for the second state.

12. The apparatus of claim 10, wherein:

the second set of pass voltages includes a fourth pass voltage; and the compensation circuit is configured to apply the fourth pass voltage for a fourth sense operation for the second state.

13. The apparatus of claim 10, wherein:

the read circuit is configured to respond to a request to read from the selected memory cell by reading from the first unselected memory cell;

the read circuit is configured to determine data for the selected memory cell based on the first sense operation and the third sense operation if the first unselected memory cell is in a first condition; and the read circuit is configured to determine data for the selected memory cell based on the second sense operation and the fourth sense operation if the first unselected memory cell is in a second condition.

14. The apparatus of claim 13, further comprising a set of data latches coupled to the first unselected memory cell and the selected memory cell, wherein:

after reading from the first unselected memory cell, the set of data latches store first data if the first unselected memory cell is in the first condition and second data if the first unselected memory cell is in the second condition;

the read circuit is configured to store a result of the first sense operation in the set of data latches if set of data latches stores the first data; and the read circuit is configured to store a result of the second sense operation if the set of data latches stores the second data.

15. A method, comprising:

sensing a selected word line coupled to a plurality of memory cells for a plurality of states;

sequentially applying a high pass bias and a low pass bias to an adjacent word line in association with a first reference voltage for sensing a first state based on direct look ahead values associated with adjacent memory cells of the adjacent word line; and reducing the high pass bias for sensing each subsequent state that has higher threshold voltages than the first state.

16. The method of claim 15, wherein:

driving a first pass voltage during a first sense operation using the first reference voltage;

driving a second pass voltage during a second sense operation using the first reference voltage, the first pass voltage is greater than the second pass voltage;

driving a third pass voltage during a third sense operation using a second reference voltage, the second reference voltage is higher than the first reference voltage; and driving the second pass voltage during a fourth sense operation using the second reference voltage, the third pass voltage is greater than the second pass voltage and less than the first pass voltage.

17. The method of claim 16, further comprising:

prior to performing the first sense operation and the second sense operation, reading the adjacent memory cells;

if an adjacent memory cell is in a first set of states, storing a result of the first sense operation in a set of user data latches and discarding a result of the second sense operation for a selected memory cell; and if the adjacent memory cell is in a second set of states, storing the result of the second sense operation in the set of user data latches and discarding the result of the first sense operation.

18. The method of claim 15, further comprising:

applying to a plurality of unselected word lines not including the adjacent word line one or more different pass biases while applying the high pass bias and the low pass bias.

19. The method of claim 15, wherein:

the selected word line and the adjacent word line are coupled to a NAND string;

the NAND string is coupled to a bit line and a source line;

the unselected word line is adjacent to the selected word line on a drain side; and the adjacent word line is programmed subsequent to the selected word line.

20. An apparatus, comprising:

a plurality of memory cells;

means for determining a condition of a first unselected memory cell adjacent to a selected memory cell prior to sensing the selected memory cell;

means for reading the selected memory cell using a plurality of sense operations for a plurality of states, the plurality of sense operations for a particular state of the selected memory cell corresponding to different conditions of the first unselected memory cell; and means for adjusting a pass voltage applied to the first unselected memory cell during each of the plurality of sense operations, a first pass voltage for a first condition of the first unselected memory cell is greater than a second pass voltage for a second condition of the first unselected memory cell during sensing for a first state, the first pass voltage is greater than a third pass voltage for the first condition during sensing for a second state that is associated with higher threshold voltages than the first state.

* * * * *